(12) United States Patent
Mori et al.

(10) Patent No.: US 10,447,198 B2
(45) Date of Patent: Oct. 15, 2019

(54) SOLAR PANEL AND METHOD FOR MANUFACTURING SOLAR POWER GENERATION DEVICE

(71) Applicant: Sumitomo Electric Industries, Ltd., Osaka-shi (JP)

(72) Inventors: Koji Mori, Osaka (JP); Takashi Iwasaki, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 152 days.

(21) Appl. No.: 15/514,113

(22) PCT Filed: Oct. 22, 2015

(86) PCT No.: PCT/JP2015/079848
§ 371 (c)(1),
(2) Date: Mar. 24, 2017

(87) PCT Pub. No.: WO2016/063956
PCT Pub. Date: Apr. 28, 2016

(65) Prior Publication Data
US 2017/0294873 A1    Oct. 12, 2017

(30) Foreign Application Priority Data

Oct. 23, 2014    (JP) .................................. 2014-216077

(51) Int. Cl.
*H02S 30/20*    (2014.01)
*H02S 20/32*    (2014.01)
(Continued)

(52) U.S. Cl.
CPC .............. *H02S 30/20* (2014.12); *F24S 25/10* (2018.05); *F24S 25/63* (2018.05); *F24S 25/634* (2018.05);
(Continued)

(58) Field of Classification Search
CPC ........... H02S 30/20; H02S 20/20; H02S 20/30
See application file for complete search history.

(56) References Cited

U.S. PATENT DOCUMENTS

| | | |
|---|---|---|
| 4,713,492 A | 12/1987 | Hanak |
| 6,396,239 B1 | 5/2002 | Benn et al. |

(Continued)

FOREIGN PATENT DOCUMENTS

| | | |
|---|---|---|
| JP | 07-014659 U | 3/1995 |
| JP | 07-046733 B2 | 5/1995 |

(Continued)

OTHER PUBLICATIONS

International Search Report in counterpart International Application No. PCT/JP2015/079848 dated Dec. 8, 2015.

*Primary Examiner* — Devina Pillay
*Assistant Examiner* — Daniel P Malley, Jr.
(74) *Attorney, Agent, or Firm* — Baker Botts L.L.P.; Michael A. Santori

(57) ABSTRACT

A photovoltaic panel includes: a plurality of power generation portions each having a light receiving surface, each power generation portion including a plurality of power generating elements each configured to generate power in accordance with an amount of received light; and a coupling portion configured to couple each power generation portion, wherein each power generation portion is coupled so as to be rotatable about the coupling portion used as a rotation axis, and the power generation portions are capable of, by being rotated, taking a light receiving position at which the power generation portions are located such that the light receiving surfaces of the power generation portions are oriented to an identical direction, and a fold position at which the power (Continued)

generation portions are located such that a set of the light receiving surfaces of the power generation portions face each other.

2 Claims, 32 Drawing Sheets

(51) Int. Cl.

| | | |
|---|---|---|
| *H02S 20/10* | (2014.01) | |
| *H02S 20/20* | (2014.01) | |
| *F24S 25/10* | (2018.01) | |
| *F24S 25/634* | (2018.01) | |
| *F24S 25/63* | (2018.01) | |
| *H01L 31/05* | (2014.01) | |
| *H01L 31/054* | (2014.01) | |
| *F24S 30/452* | (2018.01) | |
| *H02S 40/22* | (2014.01) | |
| *F24S 25/00* | (2018.01) | |
| *F24S 25/60* | (2018.01) | |

(52) U.S. Cl.
CPC ........ *F24S 30/452* (2018.05); *H01L 31/0504* (2013.01); *H01L 31/0543* (2014.12); *H02S 20/10* (2014.12); *H02S 20/20* (2014.12); *H02S 20/32* (2014.12); *H02S 40/22* (2014.12); *F24S 2025/012* (2018.05); *F24S 2025/014* (2018.05); *F24S 2025/017* (2018.05); *F24S 2025/6006* (2018.05); *Y02E 10/47* (2013.01); *Y02E 10/52* (2013.01)

(56) References Cited

U.S. PATENT DOCUMENTS

| | | |
|---|---|---|
| 2011/0005573 A1 | 1/2011 | Chang et al. |
| 2011/0240093 A1* | 10/2011 | Tucker .................... F24S 25/65 |
| | | 136/245 |
| 2013/0340807 A1* | 12/2013 | Gerwing ................. H01L 31/02 |
| | | 136/246 |
| 2014/0076378 A1 | 3/2014 | Hamilton |

FOREIGN PATENT DOCUMENTS

| | | |
|---|---|---|
| JP | 2004-525596 A | 8/2004 |
| JP | 3877637 B2 | 2/2007 |
| JP | 2013-191728 A | 9/2013 |
| JP | 5437029 B2 | 3/2014 |
| JP | 2014-103334 A | 6/2014 |

\* cited by examiner

SOLAR PANEL AND METHOD FOR MANUFACTURING SOLAR POWER GENERATION DEVICE

TECHNICAL FIELD

The present invention relates to a photovoltaic panel and a method for manufacturing a photovoltaic apparatus, and in particular, relates to a foldable photovoltaic panel and a method for manufacturing a photovoltaic apparatus in which the photovoltaic panel is used.

BACKGROUND ART

Concentrator photovoltaic apparatuses are being developed in which sunlight is converged onto power generating elements by use of lens and the like to increase power generation efficiency of the power generating elements. Such a concentrator photovoltaic apparatus includes a photovoltaic panel having a weight of several hundred kilograms to several thousand kilograms and being mounted to the leading end of a post having a height of several meters, for example. The photovoltaic apparatus performs power generation efficiently by controlling the photovoltaic panel such that the photovoltaic panel faces the direction of the sun.

As one example of the concentrator photovoltaic apparatus, Japanese Patent 3877637 (PATENT LITERATURE 1) discloses the following technology, for example. That is, the condensing-tracking type solar power generation and hot water supply device is composed of a condensing board and a support base part. The condensing board is composed of: a frame base plate; a water flow frame laid above the upper face of the frame base plate; a solar cell sheet laid above the upper face of the water flow frame; an air flow frame laid above the upper face of the solar cell sheet; and a lens plate laid above the upper face of the air flow frame. The condensing board is configured to supply water or a cooling medium to the water flow frame for heat generated by cells of the solar cell sheet, and is configured to cool, with external air, heat generated by cells of the solar cell sheet in the air flow frame. The support base part is configured to support the condensing board in a state of always facing the sun.

CITATION LIST

Patent Literature

PATENT LITERATURE 1: Japanese Patent 3877637
PATENT LITERATURE 2: Japanese Patent 5437029
PATENT LITERATURE 3: Japanese Examined Patent Publication No. 7-46733
PATENT LITERATURE 4: Japanese Laid-Open Utility Model Publication No. 7-14659

SUMMARY OF INVENTION

Technical Problem

A concentrator photovoltaic panel includes several tens to several hundreds of power generation modules, and a frame for arranging and fixing the power generation modules, for example. In addition, the light receiving surface of such a photovoltaic panel has a quadrilateral shape whose sides are each several meters long, for example. Thus, when the photovoltaic apparatus is to be installed, it is difficult to transport the photovoltaic panel in an assembled state, from a plant to an installation site by a truck or the like. Therefore, the photovoltaic panel is assembled at the installation site in many cases.

However, in a case where the photovoltaic panel is to be assembled at the installation site, a longer work time is often needed compared with a case where the photovoltaic panel is to be assembled at the plant. This increases the work cost. In assembling the photovoltaic panel, machinery such as cranes and the like is used in many steps. This also increases the procurement cost for the machinery.

The present invention has been made in order to solve the above problem. An object of the present invention is to provide a photovoltaic panel that can simplify the work at the installation site, and a method for manufacturing a photovoltaic apparatus in which the photovoltaic panel is used.

Solution to Problem (1) In order to solve the above problem, a photovoltaic panel according to an aspect of the present invention includes: a plurality of power generation portions each having a light receiving surface, each power generation portion including a plurality of power generating elements each configured to generate power in accordance with an amount of received light; and a coupling portion configured to couple each power generation portion, wherein each power generation portion is coupled so as to be rotatable about the coupling portion used as a rotation axis, and the power generation portions are capable of, by being rotated, taking a light receiving position at which the power generation portions are located such that the light receiving surfaces of the power generation portions are oriented to an identical direction, and a fold position at which the power generation portions are located such that a set of the light receiving surfaces of the power generation portions face each other.

(6) In order to solve the above problem, a method for manufacturing a photovoltaic apparatus according to an aspect of the present invention is a method for manufacturing a photovoltaic apparatus provided with a photovoltaic panel, the photovoltaic panel including: a plurality of power generation portions each having a light receiving surface, each power generation portion including a plurality of power generating elements each configured to generate power in accordance with an amount of received light; and a coupling portion configured to couple each power generation portion so as to be rotatable about the coupling portion used as a rotation axis, the method including: a step of rotating the power generation portions, to cause the power generation portions to take a fold position at which a set of the light receiving surfaces of the power generation portions are located so as to face each other; a step of transporting the photovoltaic panel in which the power generation portions are at the fold position; a step of lifting the transported photovoltaic panel by use of a cord-like member, and carrying the photovoltaic panel to a predetermined position; and a step of loosening tension of the cord-like member at the predetermined position to rotate the power generation portions, thereby causing the power generation portions to take a light receiving position at which the light receiving surfaces of the power generation portions are located so as to be oriented to an identical direction.

The present invention can not only be realized as a photovoltaic panel, but also be realized as a photovoltaic apparatus including the photovoltaic panel.

Advantageous Effects of Invention

According to the present invention, work at the installation site can be simplified.

DESCRIPTION OF EMBODIMENTS

Figure 1:
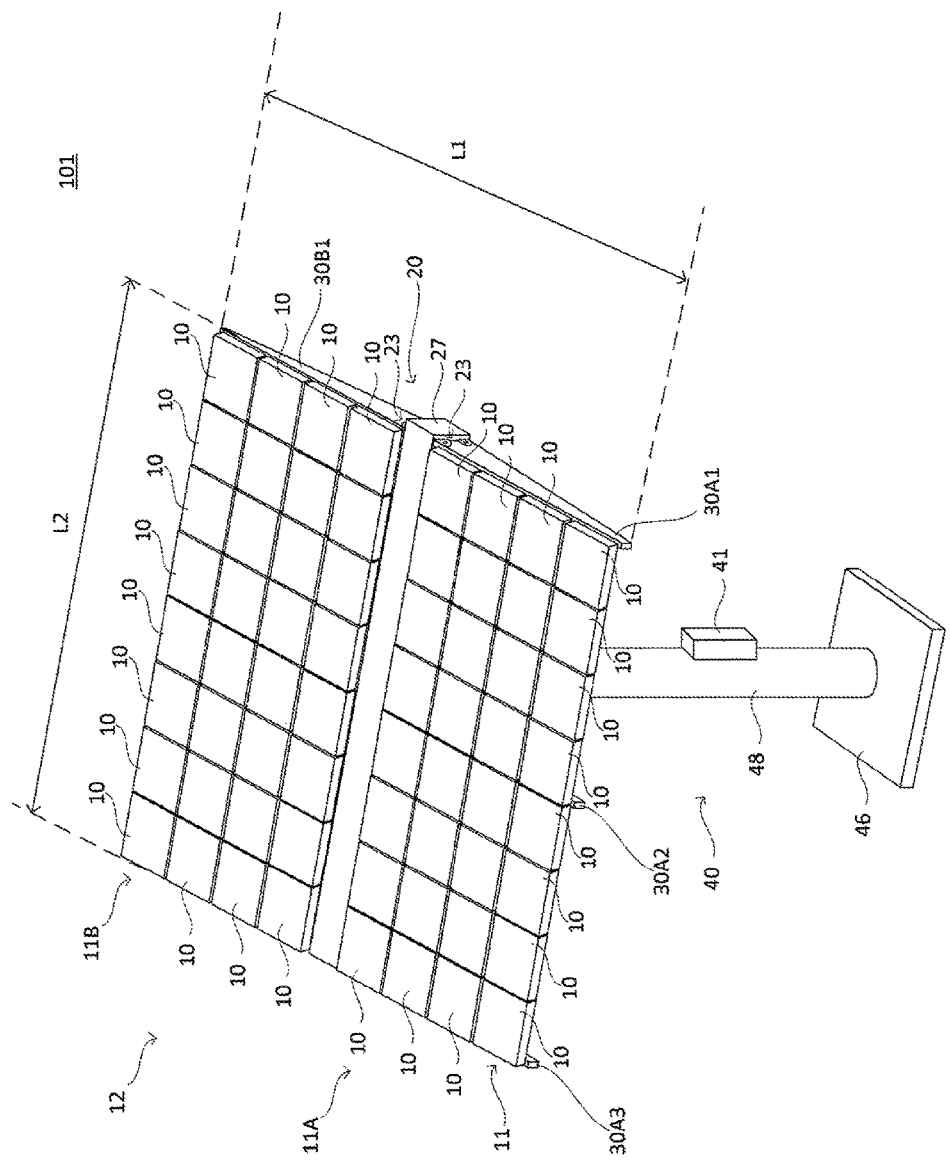
FIG. 1 is a perspective view of a photovoltaic apparatus according to a first embodiment of the present invention.

First, contents of embodiments of the present invention will be listed for description.

(1) A photovoltaic panel according to an embodiment of the present invention includes: a plurality of power generation portions each having a light receiving surface, each power generation portion including a plurality of power generating elements each configured to generate power in accordance with an amount of received light; and a coupling portion configured to couple each power generation portion, wherein each power generation portion is coupled so as to be rotatable about the coupling portion used as a rotation axis, and the power generation portions are capable of, by being rotated, taking a light receiving position at which the power generation portions are located such that the light receiving surfaces of the power generation portions are oriented to an identical direction, and a fold position at which the power generation portions are located such that a set of the light receiving surfaces of the power generation portions face each other.

According to this configuration, by disposing the power generation portions at the fold position, it is possible to make the photovoltaic panel compact. Thus, for example, the photovoltaic panel assembled at a plant can be loaded onto a truck or the like in a state where the power generation portions are disposed at the fold position, and then the photovoltaic panel can be carried into the installation site of the photovoltaic apparatus. Then, at the installation site, the power generation portions of the carried-in photovoltaic panel are rotated from the fold position to the light receiving position, whereby the shape of the photovoltaic panel can be easily changed to a shape that allows the power generation portions to receive sunlight. Thus, for example, compared with a case where components of the photovoltaic panel are carried into the installation site, and the photovoltaic panel is assembled at the installation site, the number of work steps at the installation site can be reduced, and the work time can be shortened. Therefore, the work at the installation site can be simplified.

(2) Preferably, the photovoltaic panel further includes a restoration mechanism for restoring the light receiving position.

According to this configuration, for example, after the power generation portions are rotated from the light receiving position to the fold position and the photovoltaic panel is transported, the power generation portions can be easily returned to the original position. Specifically, for example, after the angles and the like of the light receiving surfaces are adjusted in a state where the power generation portions are at the light receiving position, and then, the power generation portions are rotated from the light receiving position to the fold position, if the power generation portions are rotated to the light receiving position, the power generation portions can be returned to the state where the light receiving surfaces have been adjusted.

(3) Preferably, the photovoltaic panel further includes a hinge portion configured to rotatably support each power generation portion, the hinge portion includes a plurality of fixing portions capable of fixing the power generation portion, the plurality of fixing portions being located on a lateral side of the coupling portion along a thickness direction of the power generation portion at the light receiving position, and the fixing portion on an opposite surface side to the light receiving surface of the power generation portion is capable of canceling a fixed state of the power generation portion.

Thus, according to the configuration in which the photovoltaic panel includes the hinge portion, the power generation portions can be easily rotated. In addition, by use of the fixing portions provided on a lateral side of the coupling portion, the power generation portions can be easily made to enter a fixed state at the light receiving position, or the power generation portions can be easily made to enter a rotatable state.

(4) Preferably, the photovoltaic panel further includes: a hinge portion configured to rotatably support each power generation portion; and a support member, the coupling portion includes: a coupling portion body; and a protruding portion extending upwardly or downwardly from the coupling portion body, the protruding portion includes a first fixing portion capable of fixing a first end portion of the support member, the power generation portion includes a second fixing portion capable of fixing a second end portion of the support member, and takes the light receiving position in a state where the support member is fixed to the first fixing portion and the second fixing portion, and either one or both of the first fixing portion and the second fixing portion can cancel the fixed state of the support member.

Thus, according to the configuration in which the photovoltaic panel includes the hinge portion, the power generation portions can be easily rotated. In addition, by fixing the support member to the protruding portion and the power generation portion, it is possible to easily fix the power generation portion at the light receiving position. Further, by removing the support member from either one or both of the protruding portion and the power generation portion, it is possible to easily make the power generation portion enter a rotatable state.

(5) Preferably, the power generation portions are further capable of, by being rotated, taking an open position at which the power generation portions are located such that the set of the light receiving surfaces of the power generation portions are oriented to opposite directions.

According to this configuration, a transportation method and an installation method for the photovoltaic panel can be flexibly selected in accordance with a condition such as machinery to be used or ambient environment.

(6) A method for manufacturing a photovoltaic apparatus according to an embodiment of the present invention is a method for manufacturing a photovoltaic apparatus provided with a photovoltaic panel, the photovoltaic panel including: a plurality of power generation portions each having a light receiving surface, each power generation portion including a plurality of power generating elements each configured to generate power in accordance with an amount of received light; and a coupling portion configured to couple each power generation portion so as to be rotatable about the coupling portion used as a rotation axis, the method including: a step of rotating the power generation portions, to cause the power generation portions to take a fold position at which a set of the light receiving surfaces of the power generation portions are located so as to face each other; a step of transporting the photovoltaic panel in which the power generation portions are at the fold position; a step of lifting the transported photovoltaic panel by use of a cord-like member, and carrying the photovoltaic panel to a predetermined position; and a step of loosening tension of the cord-like member at the predetermined position to rotate the power generation portions, thereby causing the power generation portions to take a light receiving position at which the light receiving surfaces of the power generation portions are located so as to be oriented to an identical direction.

In this manner, by rotating the power generation portions to be disposed at the fold position, it is possible to make the photovoltaic panel compact. Thus, for example, the photovoltaic panel assembled at a plant can be loaded onto a truck or the like in a state where the power generation portions are disposed at the fold position, and then the photovoltaic panel can be carried into the installation site of the photovoltaic apparatus. Accordingly, for example, compared with a case where components of the photovoltaic panel are carried into the installation site and the photovoltaic panel is assembled at the installation site, the number of work steps at the installation site can be reduced, and the work time can be shortened. In addition, by loosening tension of the cord-like member lifting the photovoltaic panel, thereby to rotate the power generation portions to the light receiving position, it is possible to shorten the work time for changing the shape of the photovoltaic panel such that the power generation portions can receive sunlight. Accordingly, the work at the installation site can be simplified.

Hereinafter, embodiments of the present invention will be described with reference to the drawings. It should be noted that the same or corresponding parts in the drawings are denoted by the same reference signs, and description thereof is not repeated. At least some parts of the embodiments descried below can be combined together as desired.

First Embodiment

[Configuration and Basic Operation]

Figure 2:
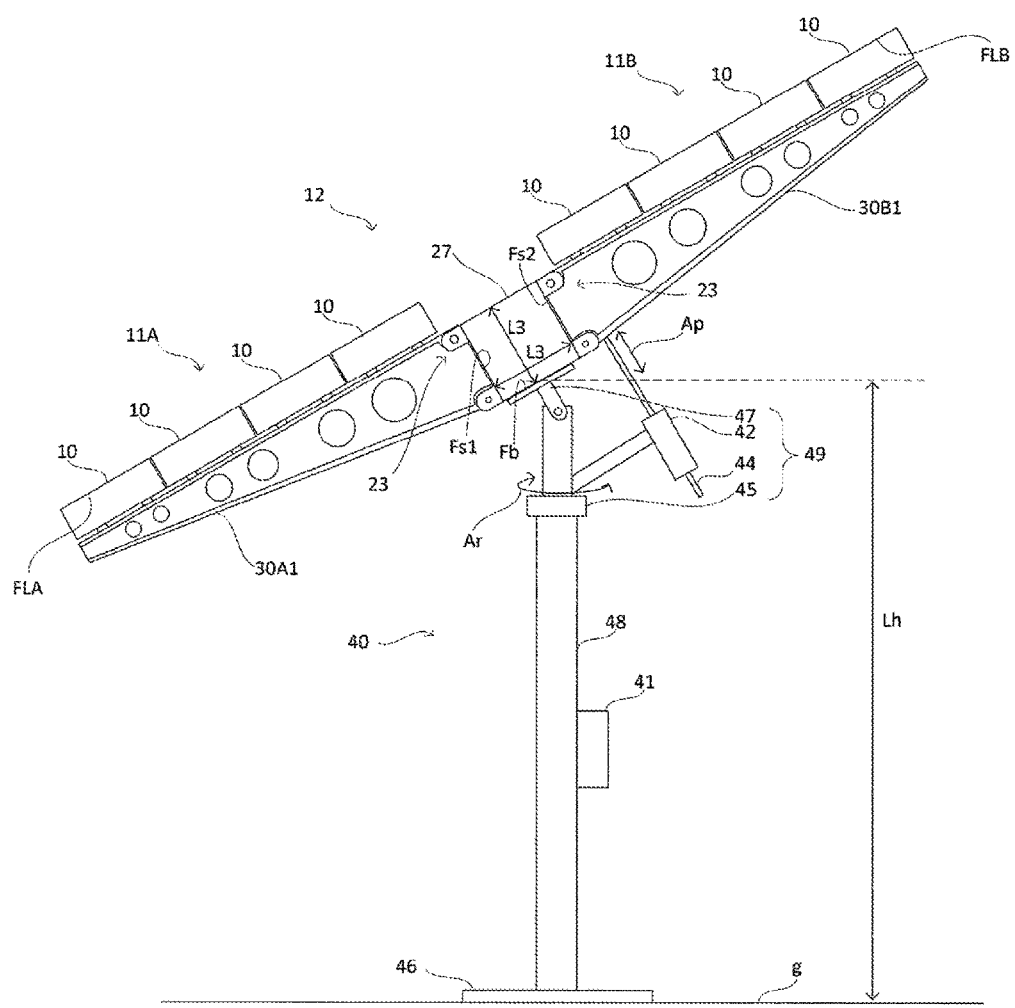
FIG. 2 is a side view of the photovoltaic apparatus shown in FIG. 1.
Figure 3:
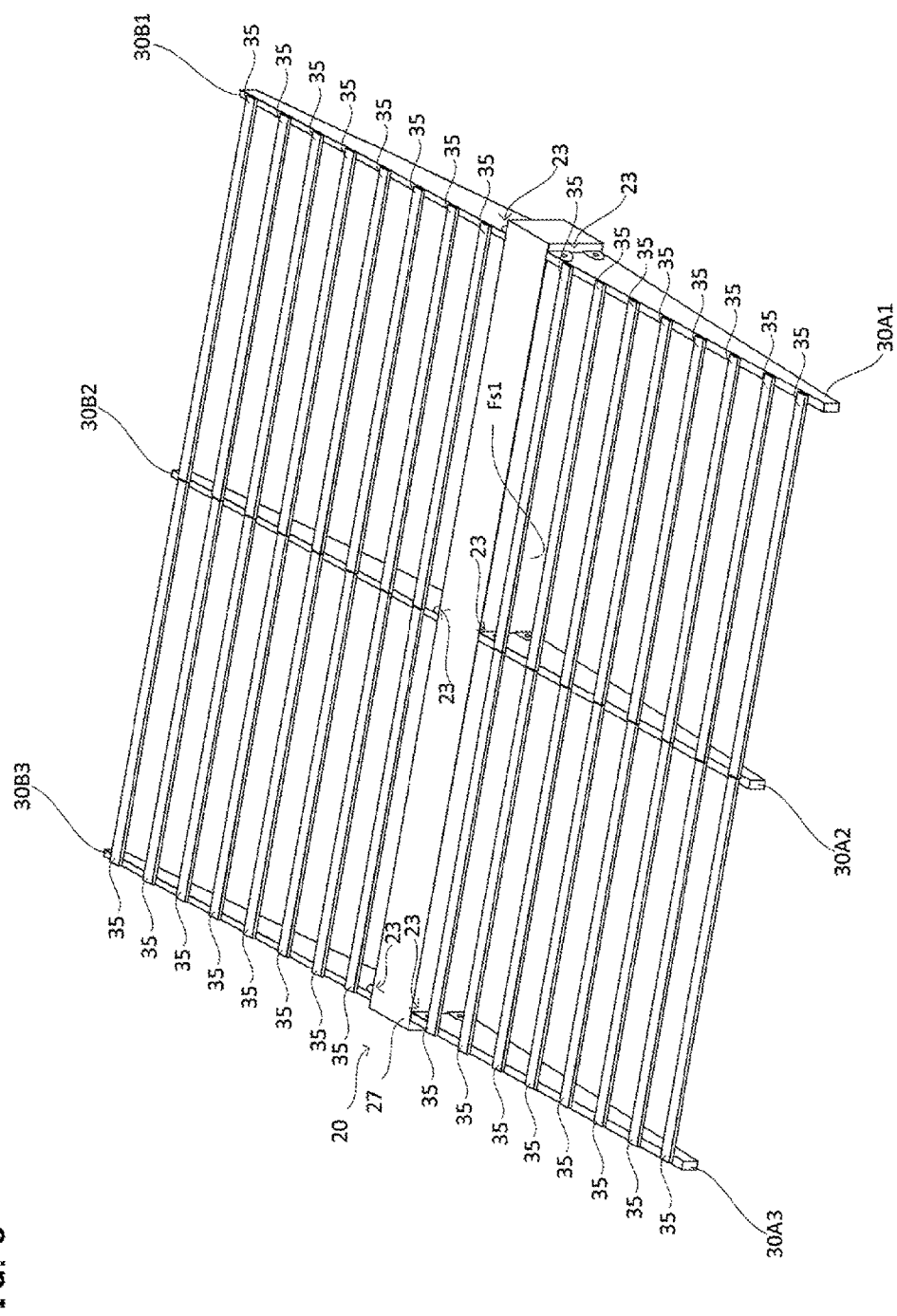
FIG. 3 shows a state where power generation modules have been removed from a photovoltaic panel shown in FIG. 1.

FIG. 1 is a perspective view of a photovoltaic apparatus according to a first embodiment of the present invention. FIG. 2 is a side view of the photovoltaic apparatus shown in FIG. 1. FIG. 3 shows a state where power generation modules have been removed from a photovoltaic panel shown in FIG. 1.

With reference to FIG. 1 to FIG. 3, a photovoltaic apparatus 101 includes a photovoltaic panel 12 and a pedestal 40. The photovoltaic panel 12 includes power generation portions 11A and 11B, a coupling portion 20, and a sun direction sensor not shown.

The power generation portion 11A includes: cantilever beams 30A1 to 30A3; 16 bridge portions 35 mounted to upper portions of the cantilever beams 30A1 to 30A3; and 4 rows×8 columns of power generation modules 10, i.e., 32 power generation modules 10, mounted to upper portions of the bridge portions 35.

The power generation portion 11B includes: cantilever beams 30B1 to 30B3; 16 bridge portions 35 mounted to upper portions of the cantilever beams 30B1 to 30B3; and 4 rows×8 columns of power generation modules 10 arranged and mounted to upper portions of the bridge portions 35. Hereinafter, each of the cantilever beams 30A1 to 30A3, 30B1 to 30B3 will also be referred to as a cantilever beam 30. In addition, each of the power generation portions 11A and 11B will also be referred to as a power generation portion 11. The power generation portion 11 has a plate shape as a whole.

The pedestal 40 includes a control panel 41, a post 48, a base 46, and a rotation head 49. The rotation head 49 includes an elevation drive portion 42, a push rod 44, an azimuth drive portion 45, and a movable mounting portion 47.

The coupling portion 20 couples the power generation portion 11A and the power generation portion 11B together. Specifically, the coupling portion 20 has a columnar shape, for example, and couples the power generation portions 11A and 11B together which are located side by side in a direction perpendicular to the longitudinal direction of the coupling portion 20.

The coupling portion 20 includes a coupling portion body 27 and a plurality of beam mounting portions 23. Specifically, in the coupling portion 20, three beam mounting portions 23 are provided to each of a side face Fs1 of the coupling portion body 27 and a side face Fs2 being the side face on the opposite side to the side face Fs1. The cantilever beams 30A1 to 30A3 are mounted to the coupling portion body 27, at the three beam mounting portions 23 provided to the side face Fs1, respectively. The cantilever beams 30B1 to 30B3 are mounted to the coupling portion body 27, at the three beam mounting portions 23 provided to the side face Fs2, respectively.

The bridge portions 35 are each a bar-shaped member, for example, and are provided to upper portions of the cantilever beams 30. Specifically, one-end portions of eight bridge portions 35 are mounted to the upper portion of the cantilever beam 30A1, and the other end portions of these bridge portions 35 are mounted to the upper portion of the cantilever beam 30A2. Further, one-end portions of eight bridge portions 35 are mounted to the upper portion of the cantilever beam 30A3, and the other end portions of these bridge portions 35 are mounted to the upper portion of the cantilever beam 30A2.

Further, one-end portions of eight bridge portions 35 are mounted to the upper portion of the cantilever beam 30B1, and the other end portions of these bridge portions 35 are mounted to the upper portion of the cantilever beam 30B2. Further, one-end portions of eight bridge portions 35 are mounted to the upper portion of the cantilever beam 30B3, and the other end portions of these bridge portions 35 are mounted to the upper portion of the cantilever beam 30B2.

Each power generation module 10 receives sunlight to generate power, and outputs DC power being the generated power, to the control panel 41.

The post 48 is set, for example, to the base 46 provided on the ground g, so as to be perpendicular to the ground. The rotation head 49 is mounted to the leading end of the post 48. The control panel 41 is mounted to a position distanced from the ground g in the post 48.

The rotation head 49 couples a lower face Fb of the coupling portion 20 and the leading end of the post 48 together. On the basis of a control signal from the control panel 41, the rotation head 49 directs the direction of the light receiving surface of the photovoltaic panel 12, i.e., the normal direction of the light receiving surface, toward the sun. Then, the rotation head 49 controls the orientation of the photovoltaic panel 12 such that the direction of the light receiving surface follows the movement of the sun.

Specifically, the rotation head 49 controls the orientation of the photovoltaic panel 12 such that the normal direction of a light receiving surface FLA of the power generation portion 11A and the normal direction of a light receiving surface FLB of the power generation portion 11B are directed to the sun.

More specifically, for example, the movable mounting portion 47 which can be tilted in the elevation direction is mounted to a center portion of the lower face Fb of the coupling portion 20. The push rod 44 passes through the inside of the elevation drive portion 42, for example, and the leading end of the push rod 44 is mounted to the photovoltaic panel 12. For example, as indicated by an arrow Ap, the elevation drive portion 42 drives the photovoltaic panel 12 in the elevation direction, by pushing the push rod 44 to the direction of the photovoltaic panel 12, or by pulling back the push rod 44 from the direction of the photovoltaic panel 12.

The azimuth drive portion 45 drives the photovoltaic panel 12 in the azimuth direction by rotating the unit above the azimuth drive portion 45 as indicated by an arrow Ar.

The sun direction sensor not shown is used for detecting the direction of the sun, and outputs a sensor signal indicating the detection result, to the control panel 41.

The control panel 41 includes: a power conditioner which converts DC power received from each power generation module 10 into AC power; a control unit for controlling the angle of the photovoltaic panel 12; and the like, for example. The control unit determines the position of the sun on the basis of the sensor signal from the sun direction sensor, and outputs, on the basis of the determination result, a control signal to the rotation head 49, for example.

A length L1 of the photovoltaic panel 12 in the longitudinal direction of the cantilever beam 30 is 5 m, for example. A length L2 of the photovoltaic panel 12 in the longitudinal direction of the coupling portion body 27 is 5 m, for example. A height Lh from the ground g to the photovoltaic panel 12 mounting portion of the pedestal 40 is 5 m, for example. The shape of the cross section of the coupling portion body 27 is a square, for example, and a length L3 of one side of the square is 0.4 m, for example.

Figure 4:
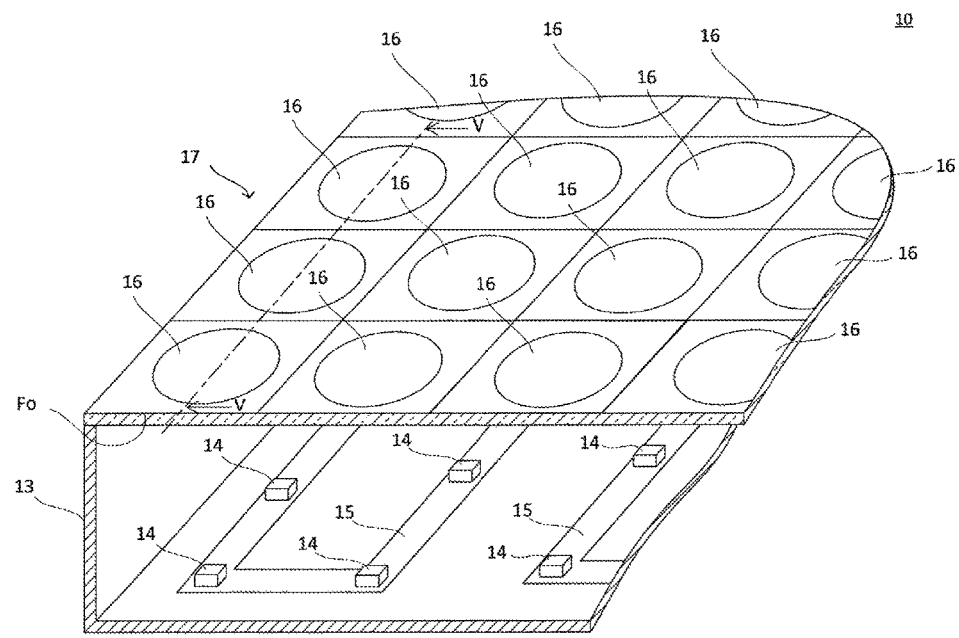
FIG. 4 shows a configuration of a photovoltaic module in the photovoltaic panel according to the first embodiment of the present invention.
Figure 5:
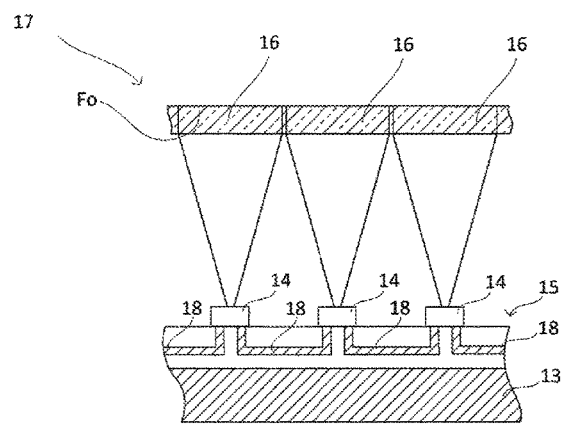
FIG. 5 is a cross-sectional view showing a cross section, along a V-V line in FIG. 4, of the photovoltaic module in the photovoltaic panel according to the first embodiment of the present invention.

FIG. 4 shows a configuration of a photovoltaic module in the photovoltaic panel according to the first embodiment of the present invention. FIG. 5 is a cross-sectional view showing the cross section, along the V-V line in FIG. 4, of the photovoltaic module in the photovoltaic panel according to the first embodiment of the present invention.

With reference to FIG. 4 and FIG. 5, the power generation module 10 includes: a housing 13; a plurality of power generating elements 14; an FPC (flexible printed circuits) 15; and a light receiving portion 17. The light receiving portion 17 includes a plurality of Fresnel lenses 16. The FPC 15 includes a conductive portion 18.

The light receiving portion 17 receives sunlight at a main surface Fo which is the upper main surface. In the light receiving portion 17, the Fresnel lenses 16 are arranged in a square lattice pattern, for example. Specifically, the Fresnel lenses 16 are arranged such that the distance between the centers of Fresnel lenses 16 adjacent to each other are equal. Each Fresnel lens 16 converges, to its corresponding power generating element 14, sunlight perpendicularly arriving at the main surface Fo of the light receiving portion 17. The light receiving portion 17 is fixed so as to be spaced from and in parallel to the bottom of the housing 13.

Each power generating element 14 is located on the optical axis of its corresponding Fresnel lens 16, and receives sunlight converged by the corresponding Fresnel lens 16, to generate power in accordance with the amount of the received light.

Each power generating element 14 is mounted to the FPC 15 having a strip shape. Power generating elements 14 that are adjacent to each other at the FPC 15 are connected in series by the conductive portion 18 included in the FPC 15, for example. Power generated by each power generating element 14 is outputted to the outside of the power generation module 10 through the conductive portion 18.

The size of the Fresnel lens 16 is 50 mm×50 mm, for example. The size of the power generating element 14 is 3.2 mm×3.2 mm, for example.

Here, for example, the light receiving surface FLA shown in FIG. 2 is an assembly of the main surfaces Fo being the upper main surfaces of the light receiving portions 17 in the respective power generation modules 10 of the power generation portion 11A. The main surface Fo may be flat or may be uneven.

Figure 6:
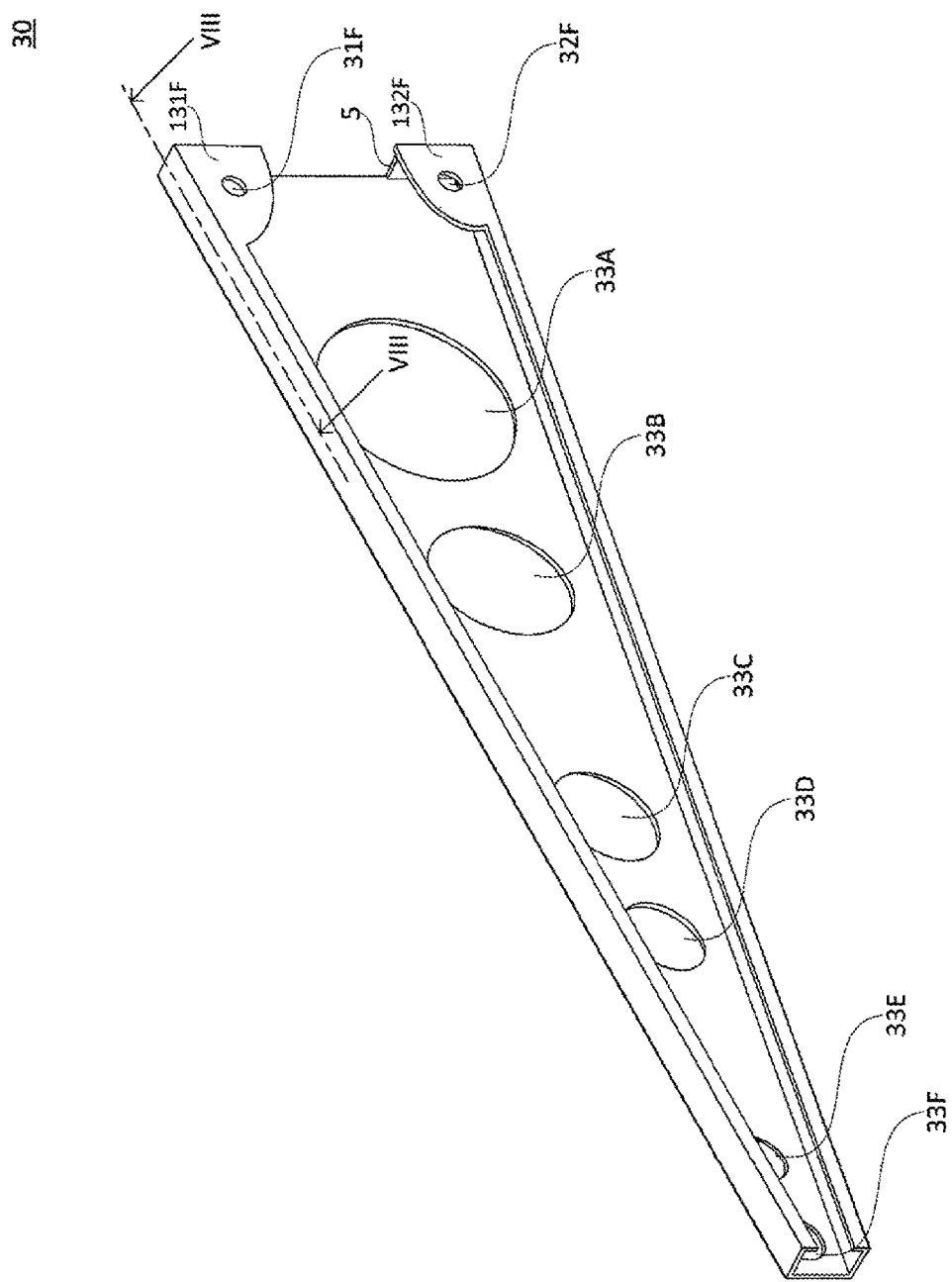
FIG. 6 shows in detail a configuration of a cantilever beam in the photovoltaic panel according to the first embodiment of the present invention.
Figure 7:
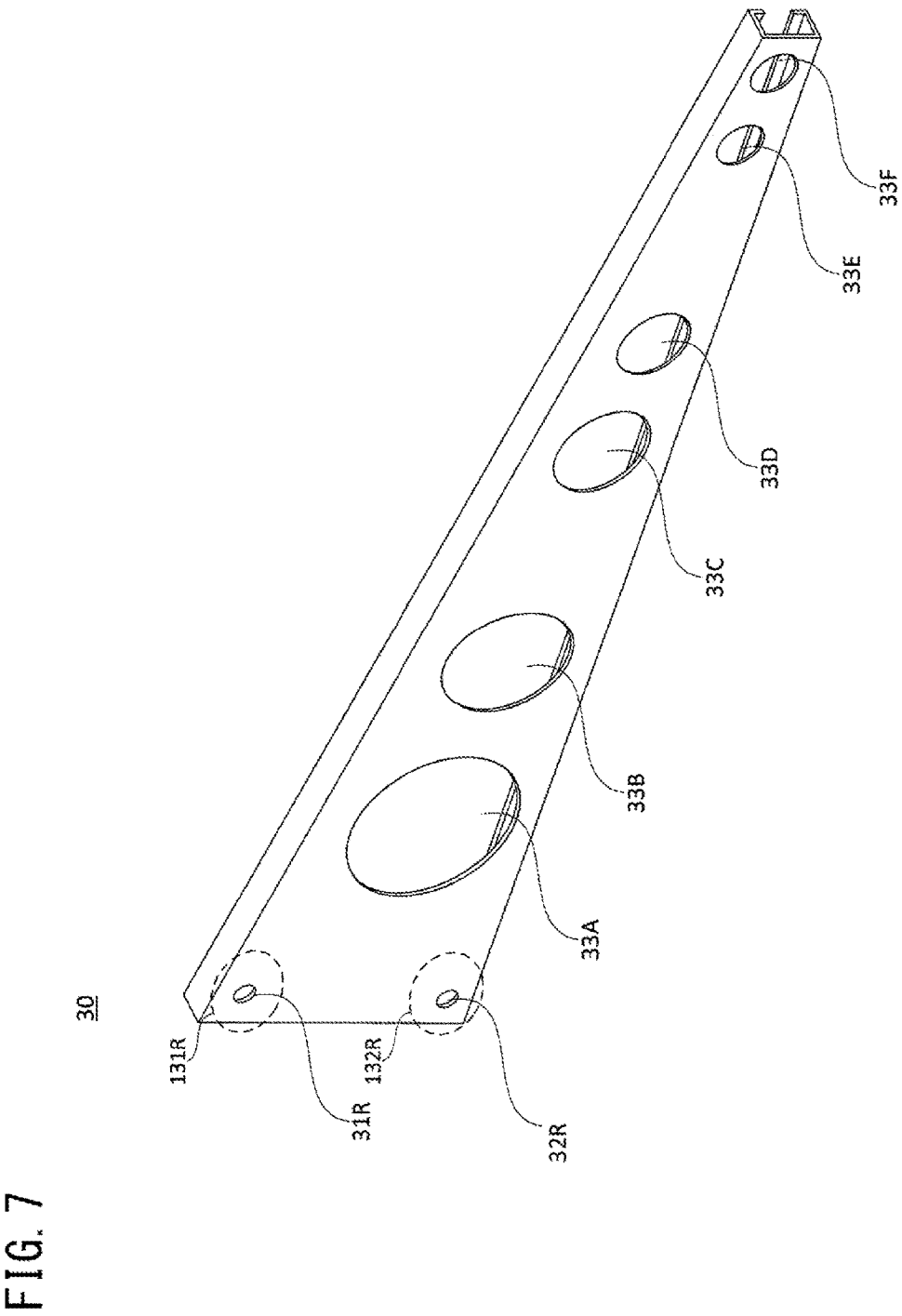
FIG. 7 shows in detail a configuration of the cantilever beam shown in FIG. 6, viewed from the opposite side.
Figure 8:
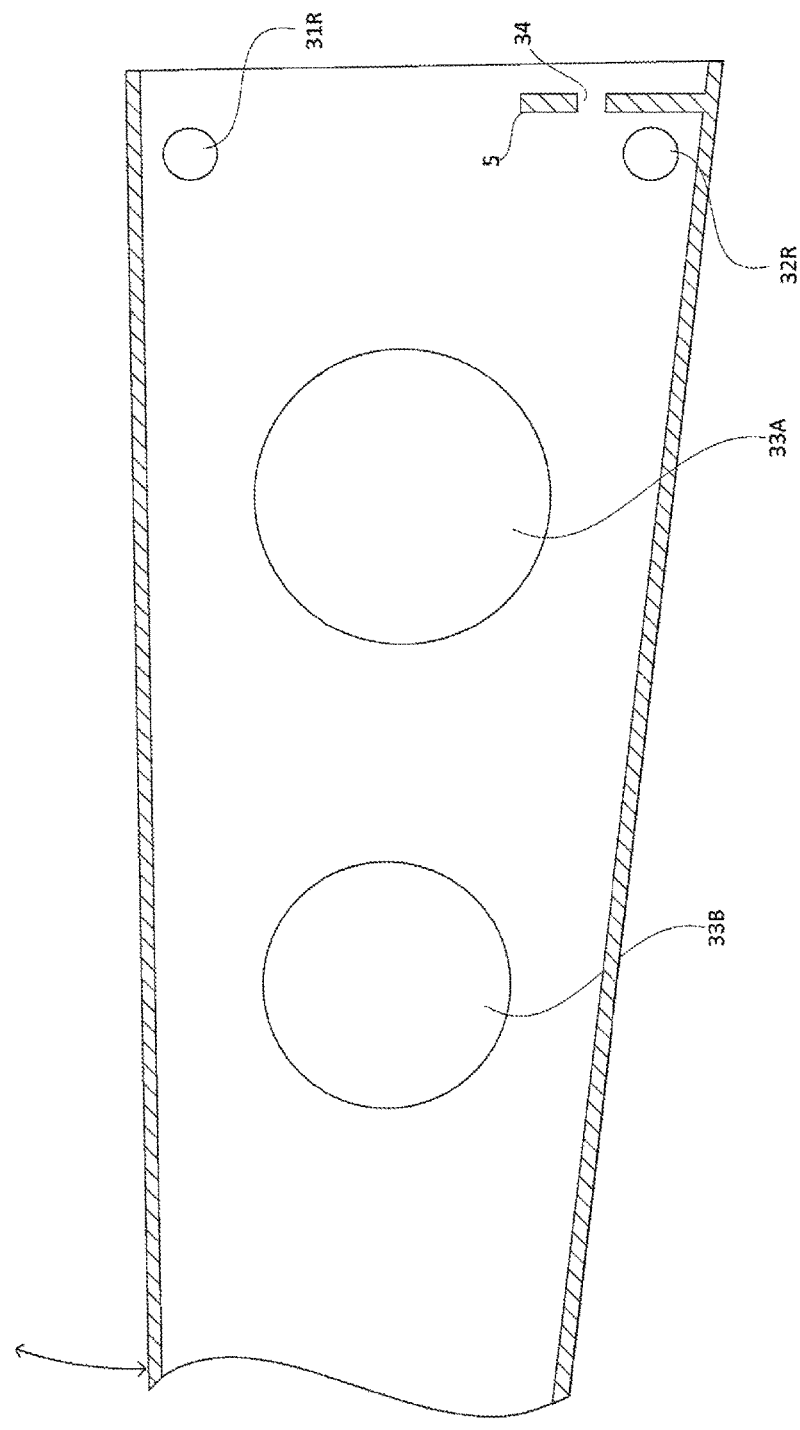
FIG. 8 is a cross-sectional view showing a cross section, along a VIII-VIII line in FIG. 6, of the cantilever beam in the photovoltaic panel according to the first embodiment of the present invention.

FIG. 6 shows in detail a configuration of the cantilever beam in the photovoltaic panel according to the first embodiment of the present invention. FIG. 7 shows in detail the configuration of the cantilever beam shown in FIG. 6, viewed from the opposite side. FIG. 8 is a cross-sectional view showing the cross section, along the VIII-VIII line in FIG. 6, of the cantilever beam in the photovoltaic panel according to the first embodiment of the present invention.

With reference to FIG. 6 to FIG. 8, the cantilever beam 30 includes: an adjustment plate portion 5; beam-side upper fixing portions 131F and 131R; and beam-side lower fixing portions 132F and 132R. In addition, the cantilever beam 30 has lightening holes 33A to 33F. The beam-side upper fixing portions 131F and 131R have mounting holes 31F and 31R, respectively. The beam-side lower fixing portions 132F and 132R have mounting holes 32F and 32R, respectively. The adjustment plate portion 5 has an adjustment bolt hole 34 provided with a tapped groove, for example.

The cantilever beam 30 is a lip channel steel having a tapered shape, for example. The lightening holes 33A to 33F are provided for weight reduction, for example. The adjustment plate portion 5 is provided in order to adjust the angle of the cantilever beam 30 relative to the short-side direction of the coupling portion body 27.

Figure 9:
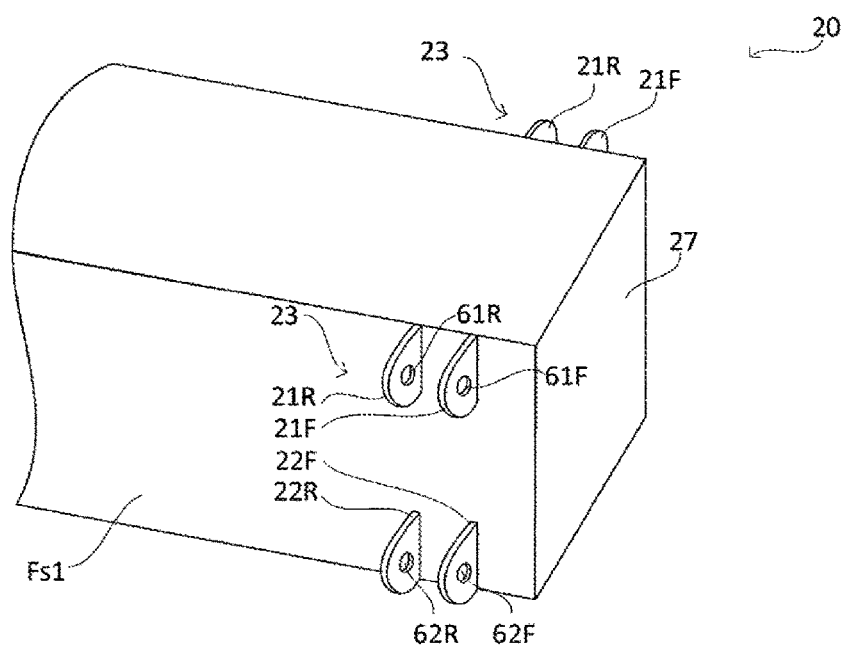
FIG. 9 shows in detail a configuration of a beam mounting portion of a coupling portion in the photovoltaic panel according to the first embodiment of the present invention.

FIG. 9 shows in detail a configuration of the beam mounting portion of the coupling portion in the photovoltaic panel according to the first embodiment of the present invention.

Figure 10:
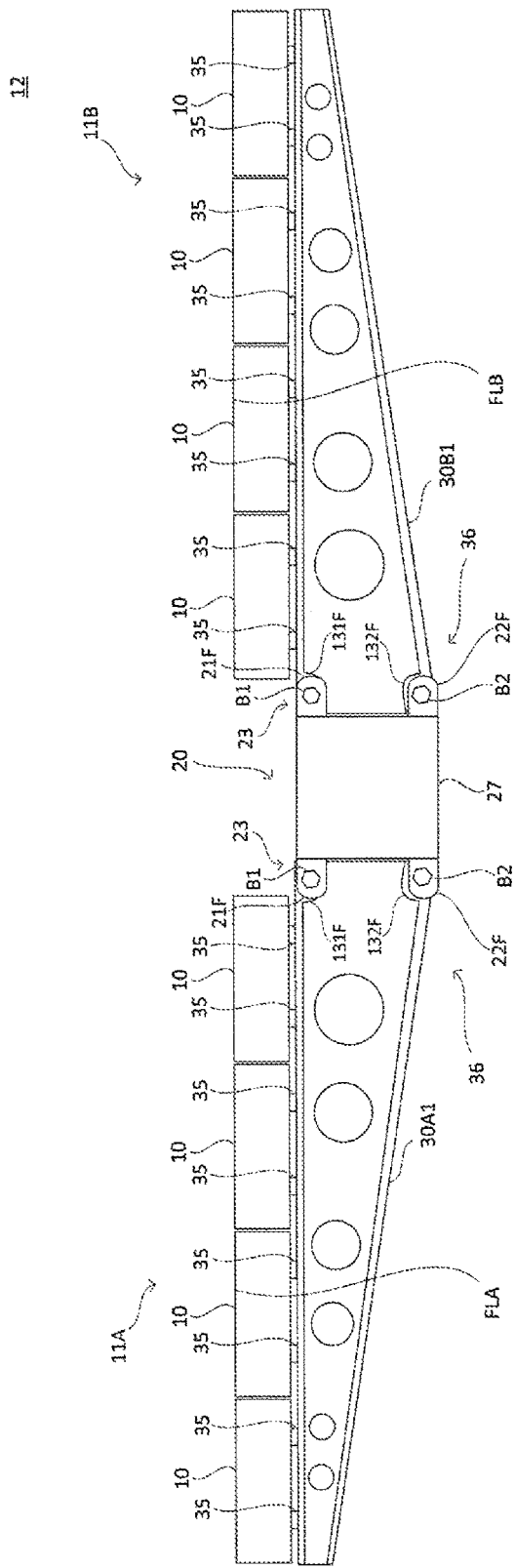
FIG. 10 is a side view of the photovoltaic panel according to the first embodiment of the present invention.
Figure 11:
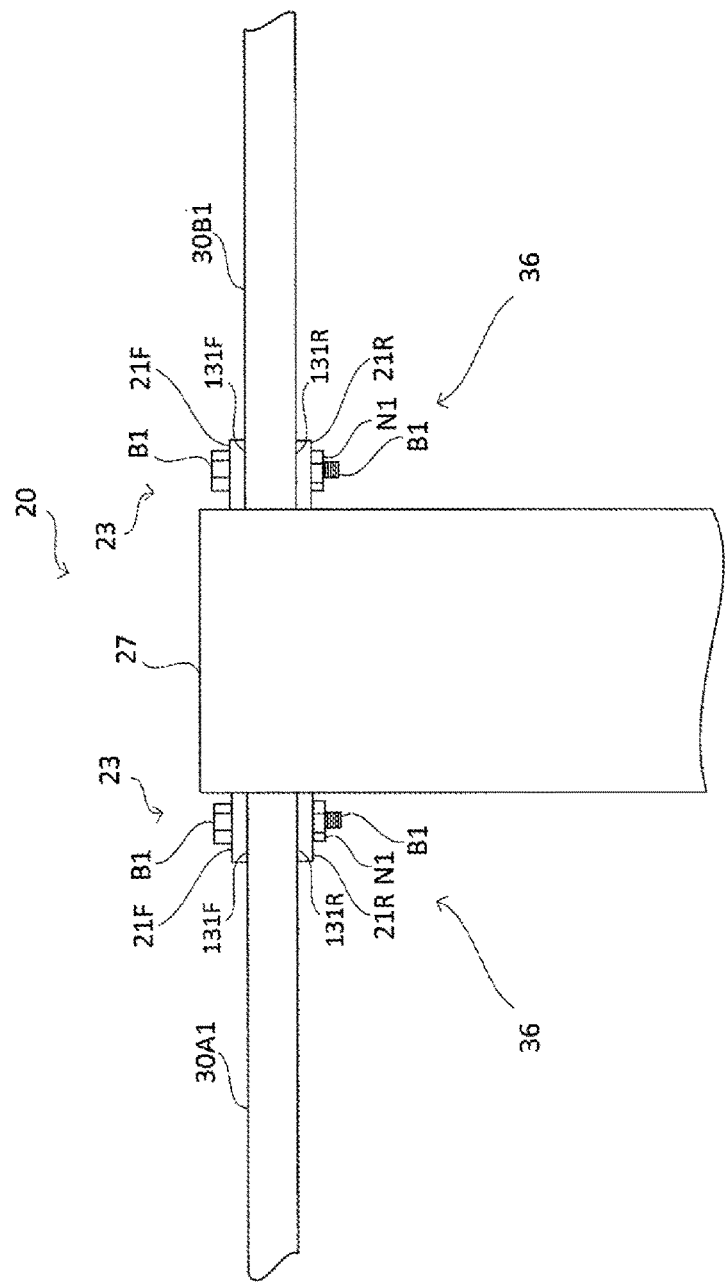
FIG. 11 is a plan view of the coupling portion and the cantilever beams in the photovoltaic panel shown in FIG. 10.
Figure 12:
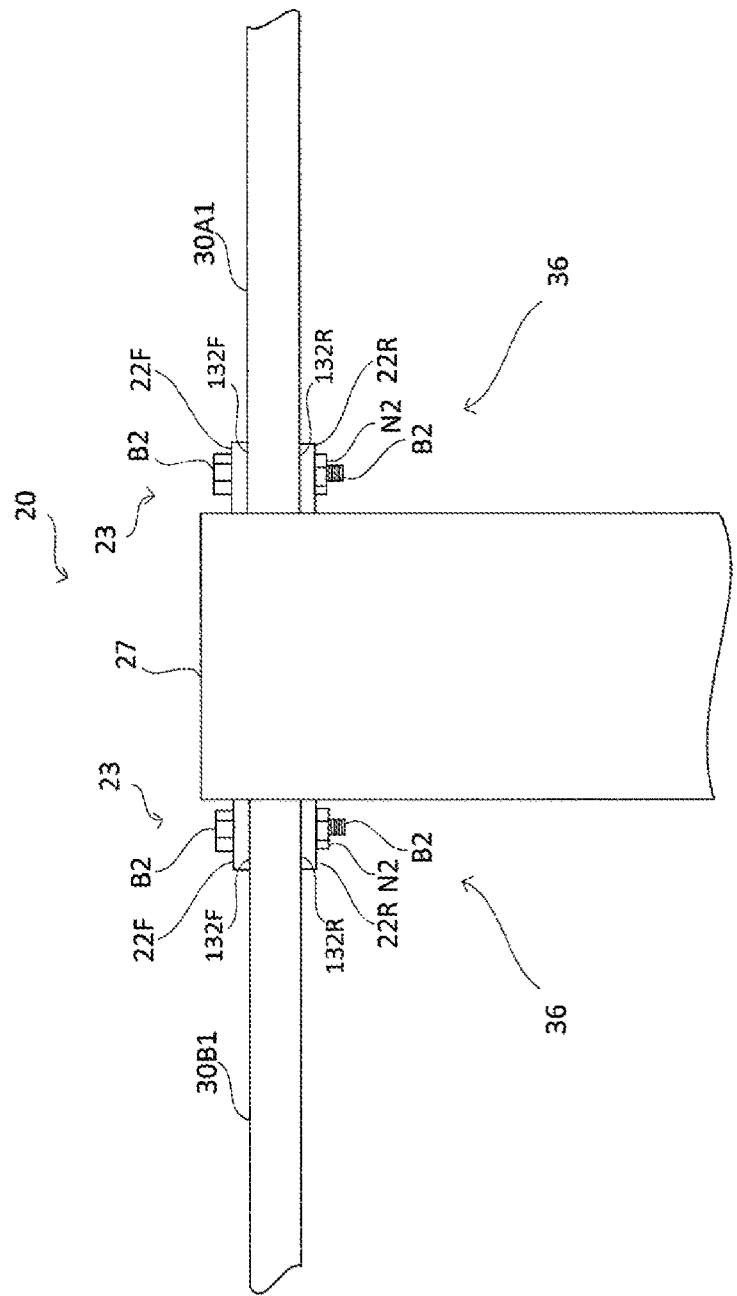
FIG. 12 is a bottom view of the coupling portion and the cantilever beams in the photovoltaic panel shown in FIG. 10.

With reference to FIG. 9, the beam mounting portion 23 includes upper fixing portions 21R and 21F, lower fixing portions 22R and 22F, bolts B1 and B2 (see FIG. 10), and nuts N1 and N2 (see FIG. 11 and FIG. 12). The upper fixing portions 21R and 21F have mounting holes 61R and 61F, respectively. The lower fixing portions 22R and 22F have mounting holes 62R and 62F, respectively.

Each of the mounting holes 61R, 61F, 62R, and 62F has a hole diameter greater to a certain extent than the thread diameter of the bolt B1, B2, for example.

The upper fixing portions 21R and 21F and the lower fixing portions 22R and 22F of the beam mounting portion 23 can fix the power generation portion 11, specifically, the cantilever beam 30 of the power generation portion 11.

FIG. 10 is a side view of the photovoltaic panel according to the first embodiment of the present invention. FIG. 11 is a plan view of the coupling portion and the cantilever beams in the photovoltaic panel shown in FIG. 10. FIG. 12 is a bottom view of the coupling portion and the cantilever beams in the photovoltaic panel shown in FIG. 10.

With reference to FIG. 10 to FIG. 12, the photovoltaic panel 12 includes a plurality of hinge portions 36. Each hinge portion 36 includes: the beam-side upper fixing portions 131F and 131R and the beam-side lower fixing portions 132F and 132R of the cantilever beam 30; and the beam mounting portion 23 provided so as to correspond to the cantilever beam 30.

The power generation portion 11A and the power generation portion 11B are fixed by the upper fixing portions 21R and 21F and the lower fixing portions 22R and 22F.

Specifically, each of the cantilever beam 30A1 and the cantilever beam 30B1 is sandwiched, at its corresponding beam mounting portion 23, between the upper fixing portion 21F and the lower fixing portion 22F, and the upper fixing portion 21R and the lower fixing portion 22R.

The bolt B1 is passed through the mounting hole 61F, the mounting holes 31F and 31R in the cantilever beam 30, and the mounting hole 61R in this order, and is fixed by the nut N1.

The bolt B2 is passed through the mounting hole 62F, the mounting holes 32F and 32R in the cantilever beam 30, and the mounting hole 62R in this order, and is fixed by the nut N2.

Each of the other cantilever beams 30A2, 30A3, 30B2, and 30B3 is also fixed to the coupling portion 20 at its corresponding beam mounting portion 23 in the same manner.

The light receiving surface FLA and the light receiving surface FLB are oriented to the same direction. Hereinafter, in the photovoltaic panel 12, the positions of the power generation portion 11A and the power generation portion 11B in a state where the power generation portion 11A and the power generation portion 11B are disposed such that the light receiving surface FLA and the light receiving surface FLB are oriented to the same direction will also be referred to as a light receiving position.

In a case where the power generation portion 11A and the power generation portion 11B are at the light receiving position, the upper fixing portion 21R and the lower fixing portion 22R of the beam mounting portion 23 in the hinge portion 36 are located along the thickness direction of the power generation portion 11A, for example. In addition, the upper fixing portion 21F and the lower fixing portion 22F are also located along the thickness direction of the power generation portion 11A.

The fixing portions, in the hinge portion 36, on the opposite surface side to the light receiving surface FLA and the light receiving surface FLB of the power generation portions 11A and 11B, i.e., the lower fixing portions 22F and the lower fixing portions 22R, can cancel the fixed state of the power generation portions 11A and 11B.

For example, the photovoltaic panel 12 can be folded by removing the bolts B2 and the nuts N2. Then, the photovoltaic panel 12 can have the original shape again.

Specifically, by removing the bolts B2 and the nuts N2, the power generation portions 11A and 11B can be rotated about their corresponding bolts B1 used as the rotation axes, respectively. Accordingly, the power generation portions 11A and 11B can take a position at which the light receiving surface FLA and the light receiving surface FLB face each other.

Hereinafter, in the photovoltaic panel 12, the positions of the power generation portion 11A and the power generation portion 11B in a state where the power generation portion 11A and the power generation portion 11B are disposed such that the light receiving surface FLA and the light receiving surface FLB face each other will also be referred to as a fold position.

After having been rotated from the light receiving position to the fold position, the power generation portions 11A and 11B can be returned to the light receiving position by being rotated in the reverse direction.

Figure 13:
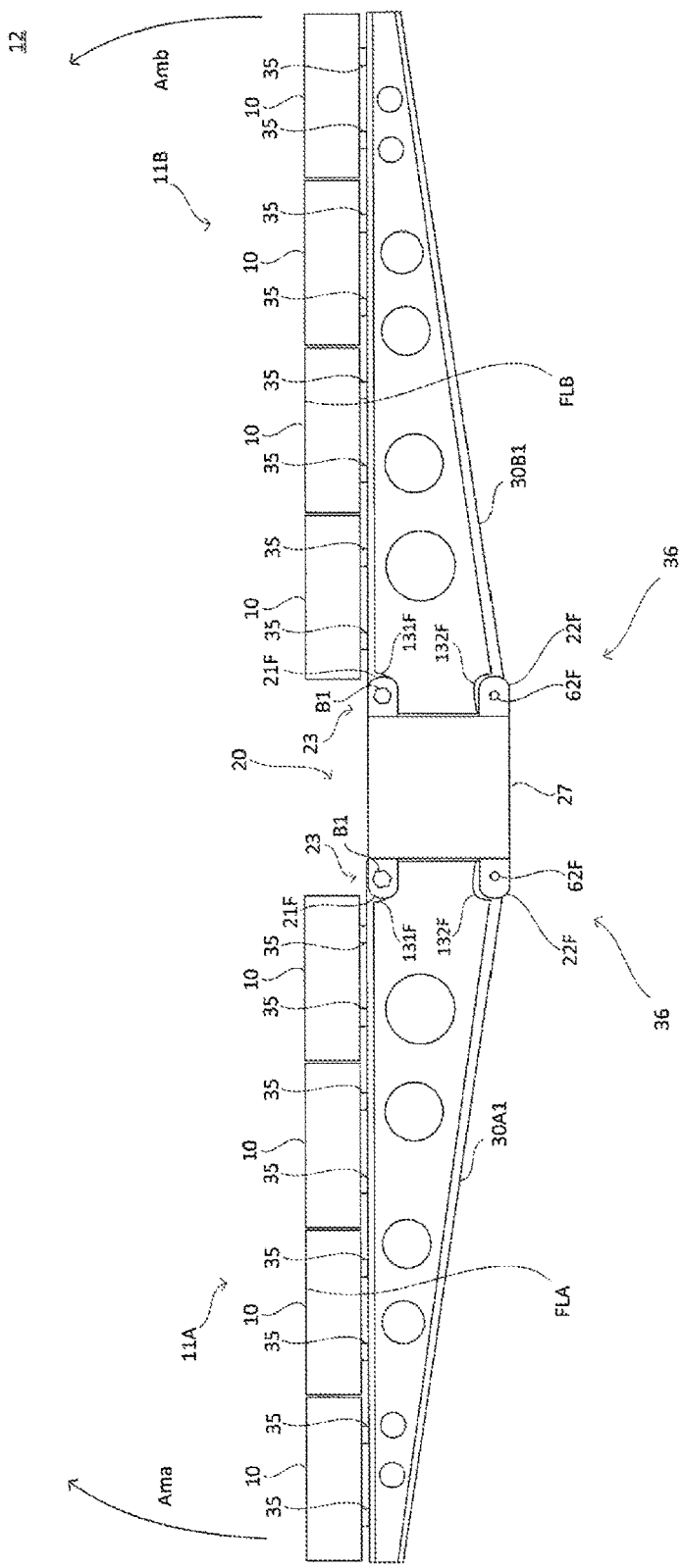
FIG. 13 is a side view showing a state of the photovoltaic panel, according to the first embodiment of the present invention, with bolts B2 removed.

FIG. 13 is a side view showing a state of the photovoltaic panel, according to the first embodiment of the present invention, with the bolts B2 removed.

With reference to FIG. 13, each hinge portion 36 rotatably supports its corresponding power generation portion 11. Specifically, the bolt B1 and the nut N1 (see FIG. 11) are mounted to each beam mounting portion 23. More specifically, as also shown in FIG. 6, FIG. 7, and FIG. 9, the bolt B1 is passed through the mounting hole 61F in the upper fixing portion 21F, the mounting holes 31F and 31R in the cantilever beam 30, and the mounting hole 61R in the upper fixing portion 21R in this order, and is fixed by the nut N1. Meanwhile, the bolt B2 and the nut N2 are not mounted.

In this state, the bolt B1, the nut N1, the upper fixing portion 21F in the beam mounting portion 23, the beam-side upper fixing portions 131F and 131R in the cantilever beam 30, and the upper fixing portion 21R in the beam mounting portion 23 constitute the hinge portion.

In this state, as indicated by an arrow Ama, the cantilever beam 30A1 can be rotated about the bolt B1, used as the rotation axis, in its corresponding beam mounting portion 23. Also, as indicated by an arrow Amb, the cantilever beam 30B1 can be rotated about the bolt B1, used as the rotation axis, in its corresponding beam mounting portion 23.

Figure 14:
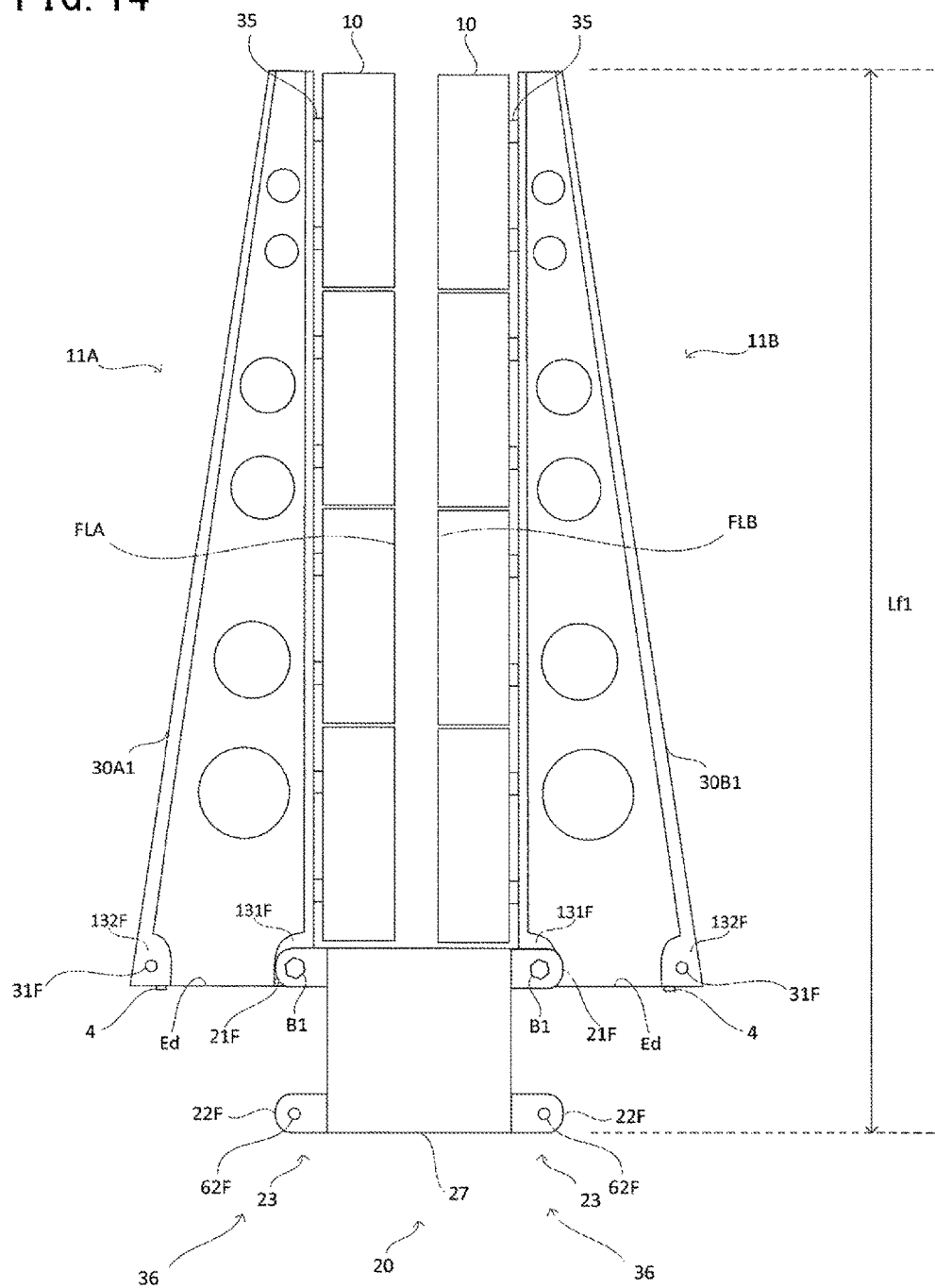
FIG. 14 is a side view showing a state where power generation portions in the photovoltaic panel according to the first embodiment of the present invention are at the fold position.

FIG. 14 is a side view showing a state where the power generation portions in the photovoltaic panel according to the first embodiment of the present invention are at the fold position.

With reference to FIG. 14, at the fold position, the power generation portion 11A and the power generation portion 11B are located such that the light receiving surface FLA and the light receiving surface FLB face each other. The leading ends of push bolts 4 described later protrude from the cantilever beams 30, respectively. Specifically, each push bolt 4 protrudes from an end Ed being the end on the coupling portion 20 side of the cantilever beam 30 when the power generation portion 11A, 11B is at the light receiving position.

A length Lf1, in the longitudinal direction of the cantilever beam 30, of the photovoltaic panel 12 in which the power generation portion 11A and the power generation portion 11B are at the fold position is about 2.7 meters, for example.

Figure 15:
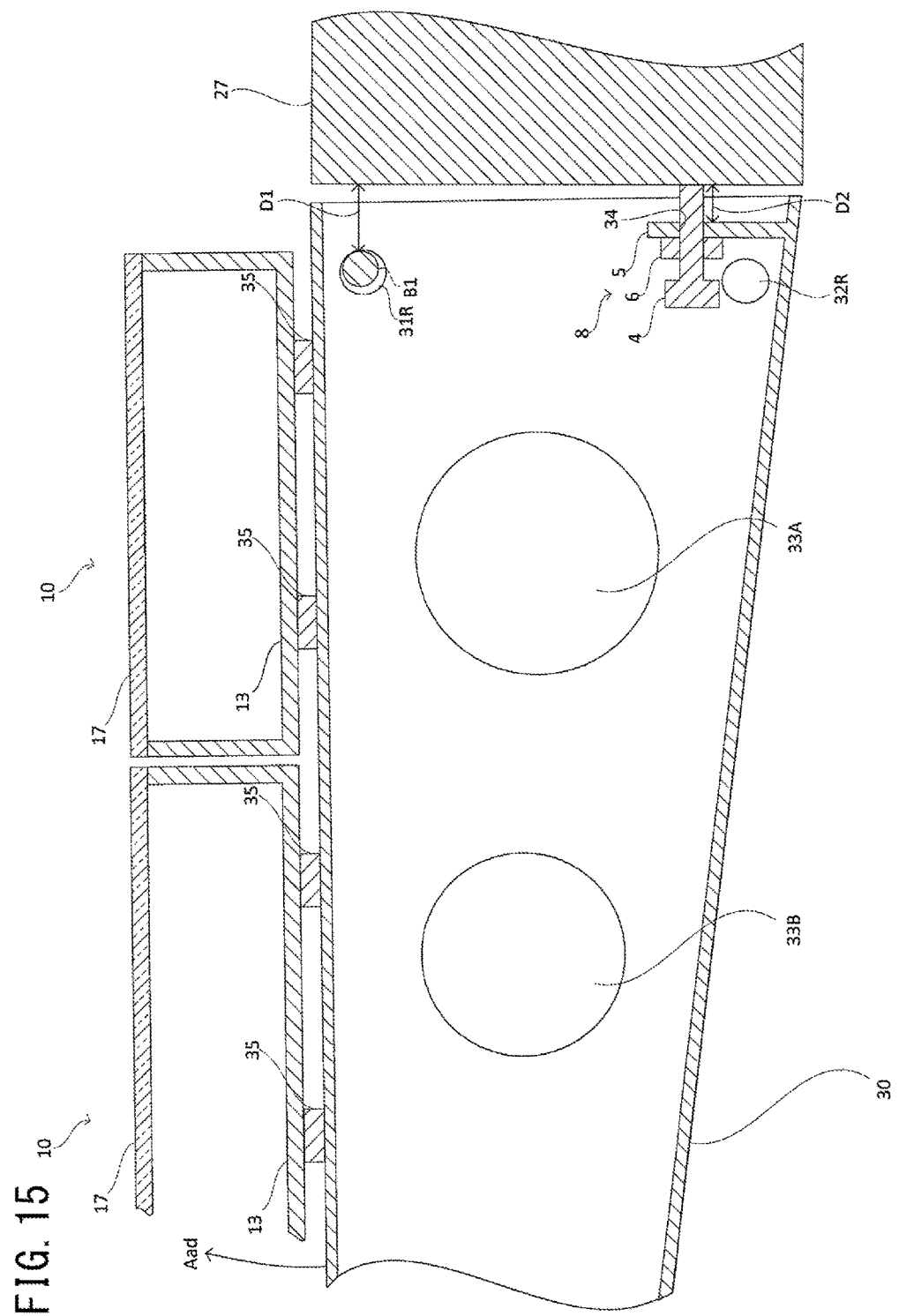
FIG. 15 is a diagram for explaining an adjustment mechanism in the photovoltaic apparatus according to the first embodiment of the present invention.

FIG. 15 is a diagram for explaining an adjustment mechanism in the photovoltaic apparatus according to the first embodiment of the present invention.

FIG. 15 shows the cross section shown in FIG. 8 in which other portions of the photovoltaic panel 12 are included.

With reference to FIG. 15, the photovoltaic panel 12 includes an adjustment mechanism (restoration mechanism) 8. The adjustment mechanism 8 includes the adjustment plate portion 5 provided to the cantilever beam 30, the push bolt 4, and a nut 6.

As described with reference to FIG. 8, the adjustment plate portion 5 has the adjustment bolt hole 34 provided with a tapped groove. The push bolt 4 is fitted in the adjustment bolt hole 34. The nut 6 is provided between the head of the push bolt 4 and the adjustment plate portion 5.

The adjustment mechanism 8 is a screw mechanism provided in order to adjust the angle of the cantilever beam 30 relative to the short-side direction of the coupling portion 20, and is fixed to the cantilever beam 30. Specifically, for example, the adjustment plate portion 5 in the cantilever beam 30 is fixed to the cantilever beam 30 by welding or the like.

Here, the power generation portions 11A and 11B are at the light receiving position. The leading end of the push bolt 4 in the adjustment mechanism 8 is in contact with the coupling portion body 27. In this state, the adjustment mechanism 8 can adjust, for example, the distance between the coupling portion body 27 and the power generation portion 11A, specifically, the distance between the coupling portion body 27 and the adjustment plate portion 5 fixed to the cantilever beam 30.

More specifically, by rotating the push bolt 4 in a state where the leading end of the push bolt 4 is in contact with the coupling portion body 27, it is possible to increase a distance D2 between the adjustment plate portion 5 and the coupling portion 20, for example.

At this time, a distance D1 between the coupling portion 20 and the bolt B1 passed through the mounting hole 31R and the like hardly changes. Thus, as indicated by an arrow Aad, the cantilever beam 30 is rotated about the bolt B1 used as the rotation axis, in the direction toward the power generation module 10. The push bolt 4 in each cantilever beam 30 is fixed by the nut 6.

By adjusting the adjustment mechanism 8 in each cantilever beam 30, it is possible to make the light receiving surface FLA and the light receiving surface FLB closer to an ideal plane with no distortion, and it is possible to accurately direct the light receiving surface FLA and the light receiving surface FLB to the same direction in a case where the power generation portion 11A and the power generation portion 11B are at the light receiving position.

The adjustment mechanism 8 stores, for example, the adjusted distance between the coupling portion body 27 and the power generation portion 11A, specifically, the adjusted distance between the coupling portion body 27 and the adjustment plate portion 5. For example, after the power generation portion 11A, 11B is rotated from the light receiving position to the fold position, the power generation portion 11A, 11B is rotated toward the light receiving position. In this case, the push bolt 4 comes into contact with the coupling portion body 27, thereby stopping the rotation of the power generation portion 11A, 11B.

At the position where the push bolt 4 has stopped the rotation of the power generation portion 11A, 11B, the distance between the adjustment plate portion 5 and the coupling portion body 27 is the same as the distance before the power generation portion 11A, 11B is rotated from the light receiving position to the fold position. Accordingly, the position taken by the power generation portion 11A, 11B is the same as the position before the power generation portion 11A, 11B is rotated to the fold position. That is, the adjustment mechanism 8 can restore the light receiving position for the power generation portion 11A, 11B.

[Assembling of Photovoltaic Apparatus]

Next, assembling of the photovoltaic apparatus 101 will be described.

Figure 16:
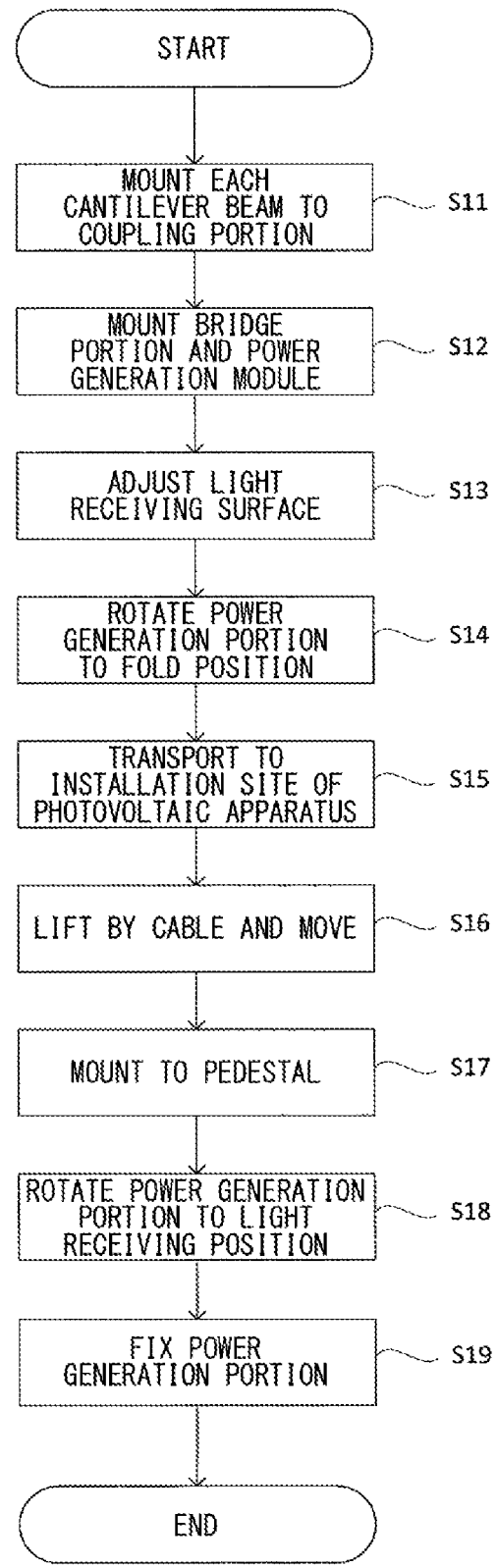
FIG. 16 is a flow chart specifying one example procedure of assembling the photovoltaic apparatus according to the first embodiment of the present invention.

FIG. 16 is a flow chart specifying one example procedure of assembling the photovoltaic apparatus according to the first embodiment of the present invention.

With reference to FIG. 16, first, each cantilever beam 30 is mounted to the coupling portion 20 (step S11). Specifically, each cantilever beam 30 is rotatably mounted to the coupling portion 20.

Figure 17:
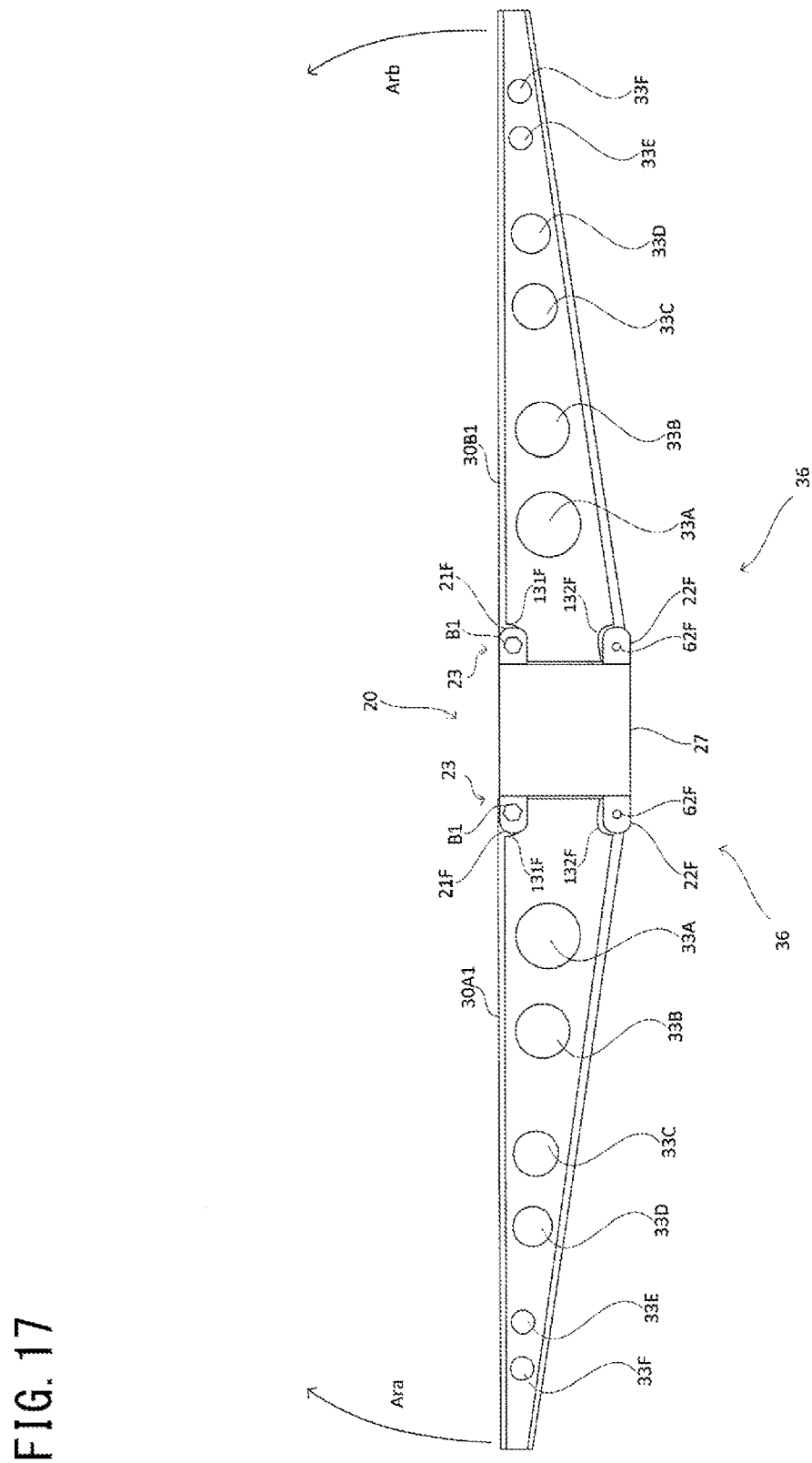
FIG. 17 is a side view showing a state where the cantilever beams in the photovoltaic panel according to the first embodiment of the present invention are rotatably mounted to the coupling portion.

FIG. 17 is a side view showing a state where the cantilever beams in the photovoltaic panel according to the first embodiment of the present invention are rotatably mounted to the coupling portion.

With reference to FIG. 17, each of the cantilever beam 30A1 and the cantilever beam 30B1 is mounted to the coupling portion 20, at its corresponding beam mounting portion 23. Specifically, also as shown in FIG. 11 and FIG. 12, each of the cantilever beam 30A1 and the cantilever beam 30B1 is sandwiched, at its corresponding beam mounting portion 23, between the upper fixing portion 21F and the lower fixing portion 22F, and the upper fixing portion 21R and the lower fixing portion 22R. Also as shown in FIG. 6, FIG. 7, and FIG. 9, the bolt B1 is passed through the mounting hole 61F in the upper fixing portion 21F, the mounting holes 31F and 31R in the cantilever beam 30, and the mounting hole 61R in the upper fixing portion 21R in this order, and is fixed by the nut N1 (see FIG. 11). Here, the bolt B1 is in a state of being temporarily fixed by the nut N1, for example.

In this state, as indicated by an arrow Ara, the cantilever beam 30A1 can be rotated about the bolt B1, used as the rotation axis, in its corresponding beam mounting portion 23. Also as indicated by an arrow Arb, the cantilever beam 30B1 can be rotated about the bolt B1, used as the rotation axis, in its corresponding beam mounting portion 23.

With reference to FIG. 16 again, next, the bridge portions 35 are mounted to an upper portion of each cantilever beam 30, and then, the power generation modules 10 are mounted to upper portions of the mounted bridge portions 35 (step S12).

Figure 18:
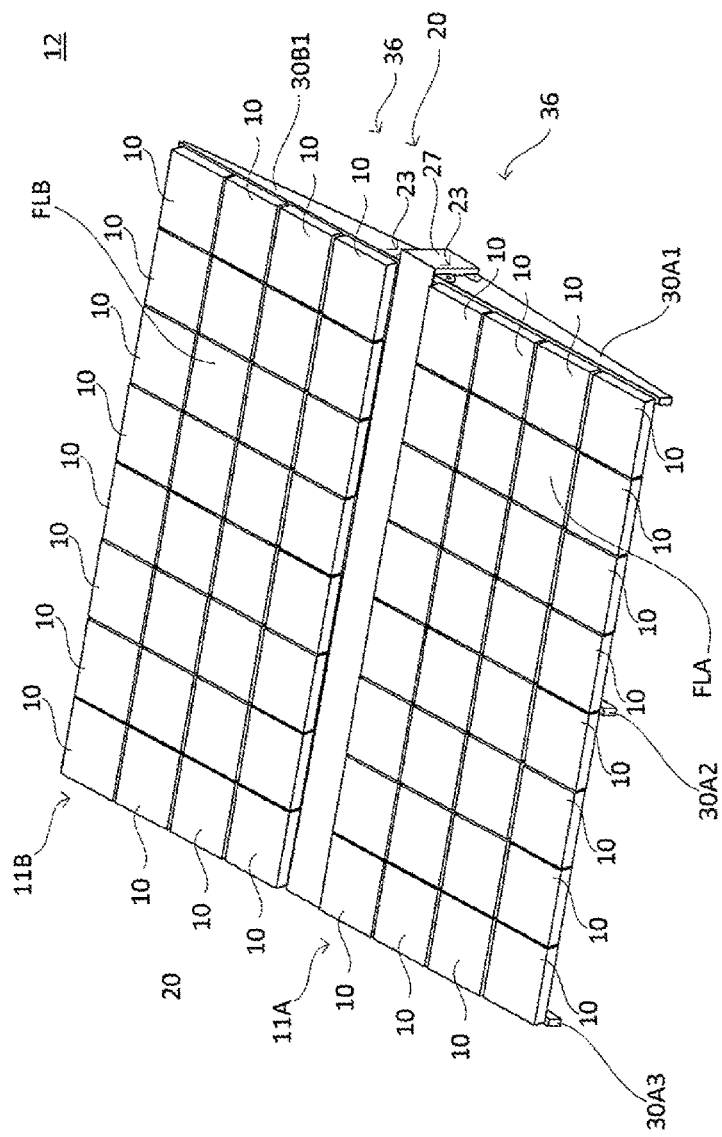
FIG. 18 is a perspective view of the photovoltaic panel according to the first embodiment of the present invention.

FIG. 18 is a perspective view of the photovoltaic panel according to the first embodiment of the present invention.

With reference to FIG. 18, the bridge portions 35 (see FIG. 3) are mounted to upper portions of the cantilever beams 30, and the power generation modules 10 are mounted to upper portions of the bridge portions 35.

With reference to FIG. 16 again, next, adjustment of the light receiving surface FLA and the light receiving surface FLB is performed (step S13). For example, in the photovoltaic panel 12 immediately after being assembled through the steps as described above, the light receiving surface FLA and the light receiving surface FLB are not accurately oriented to the same direction in some cases. In addition, for example, there are cases in which, due to variation in dimensions of the cantilever beams 30 and the like, the inclinations of the surfaces on the power generation module 10 side of the respective cantilever beams 30 are different depending on the power generation modules 10, thus causing a big distortion from the ideal plane of the light receiving surface FLA of the power generation portion 11A and the light receiving surface FLB of the power generation portion 11B.

In a case where the photovoltaic panel 12 in such a state is used in the photovoltaic apparatus 101, the power generation efficiency of the photovoltaic apparatus 101 could become extremely low. Specifically, for example, if the direction of the light receiving surface FLA and the light receiving surface FLB is shifted by 2 degrees from the direction of the sun, the power generation efficiency is approximately halved.

Thus, in order to make the light receiving surface FLA and the light receiving surface FLB closer to an ideal plane with no distortion and in order to cause the light receiving surface FLA and the light receiving surface FLB to be oriented to the same direction, adjustment of the inclination of each cantilever beam 30, i.e., adjustment of the light receiving surface FLA and the light receiving surface FLB, is performed.

Specifically, for example, while levels are located at a plurality of places in each of the light receiving surface FLA and the light receiving surface FLB shown in FIG. 18, the push bolt 4 of the adjustment mechanism 8 in each cantilever beam 30 is rotated to adjust the angle of the cantilever beam 30, such that the entirety of the light receiving surface FLA and the entirety of the light receiving surface FLB become horizontal. The push bolt 4 in each cantilever beam 30 is fixed by the nut 6 at the adjusted position.

The adjustment of the light receiving surface FLA and the light receiving surface FLB, i.e., the adjustment of the angle of each cantilever beam 30, may be performed before the power generation modules 10 are mounted to the bridge portions 35, or may be performed before the bridge portions 35 are mounted to the cantilever beams 30.

The adjustment of the angle of each cantilever beam 30 may be performed at each of all the timings of: before the power generation modules 10 are mounted to the bridge portions 35, before the bridge portions 35 are mounted to the cantilever beams 30, and after the power generation modules 10 are mounted to the bridge portions 35.

Next, the power generation portions 11A and 11B are rotated such that the power generation portions 11A and 11B are located at the fold position (step S14). Specifically, for example, the power generation portions 11A and 11B in the state shown in FIG. 13 are rotated about their corresponding bolts B1 used as the rotation axes, respectively, to enter the state shown in FIG. 14.

As a result of the power generation portion 11A and the power generation portion 11B taking the fold position, the photovoltaic panel 12 becomes compact. Specifically, the length L1, in the longitudinal direction of the cantilever beam 30, of the photovoltaic panel 12 in which the power generation portion 11A and the power generation portion 11B are at the light receiving position is 5 m, for example. On the other hand, the length Lf1, in the longitudinal direction of the cantilever beam 30, of the photovoltaic panel 12 in which the power generation portion 11A and the power generation portion 11B are at the fold position is about 2.7 meter, for example. The operations of steps S11 to S14 are performed in a plant, for example.

Next, the photovoltaic panel 12 in which the power generation portions 11A and 11B are at the fold position is transported to the installation site of the photovoltaic apparatus 101 (step S15).

Figure 19:
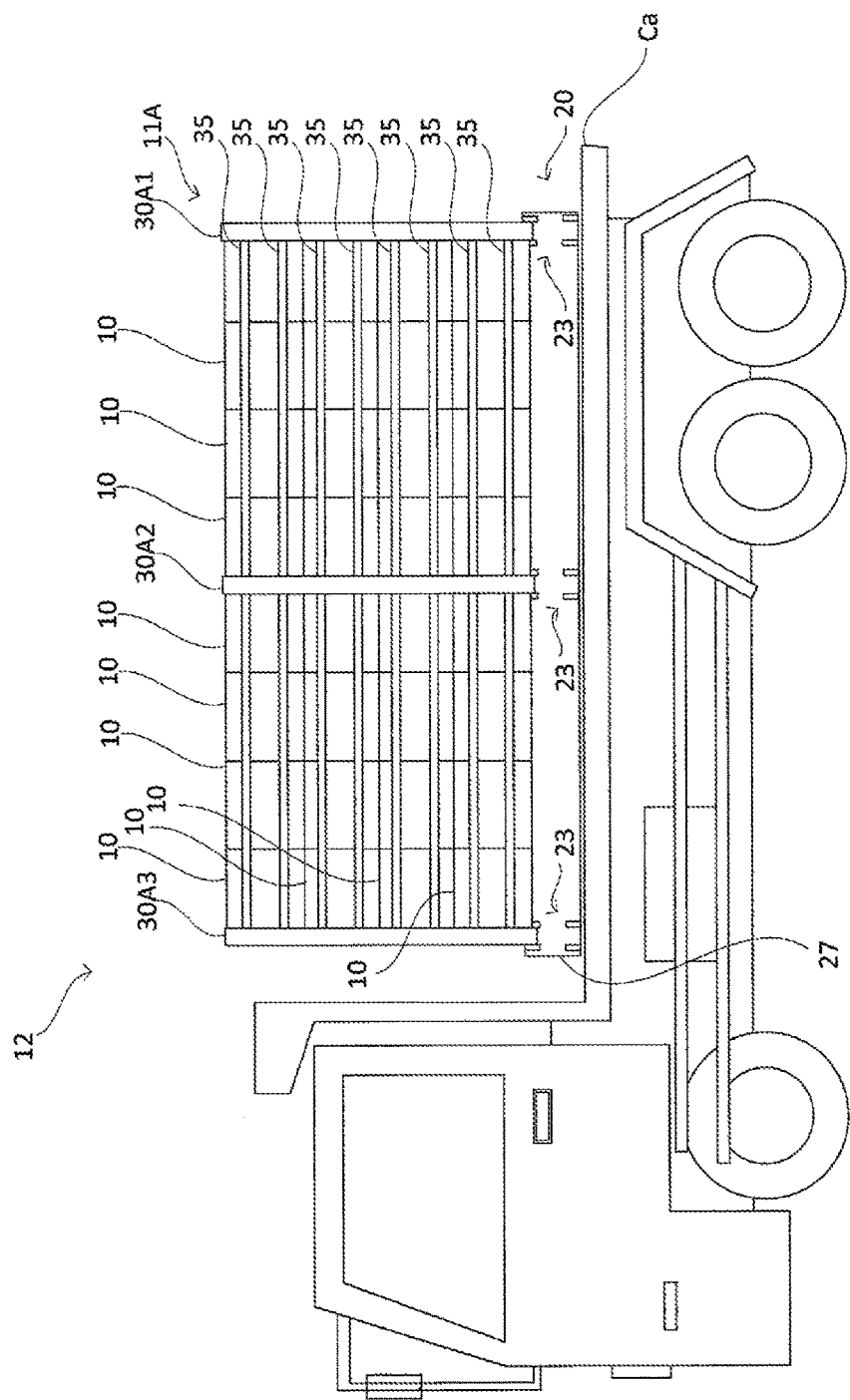
FIG. 19 shows a state where the photovoltaic panel according to the first embodiment of the present invention is being transported by a truck.

FIG. 19 shows a state where the photovoltaic panel according to the first embodiment of the present invention is being transported by a truck.

With reference to FIG. 19, the power generation portion 11A and the power generation portion 11B are at the fold position in the photovoltaic panel 12. Since the power generation portion 11A and the power generation portion 11B are at the fold position, it is possible to reduce the height of the photovoltaic panel 12 from a cargo bed Ca of a truck, for example. This facilitates transportation of the photovoltaic panel 12, accordingly.

With reference to FIG. 16 again, next, the photovoltaic panel 12 having been carried in the installation site of the photovoltaic apparatus 101 is lifted by use of, for example, a cable (cord-like member) 54 to be moved to a predetermined position (step S16).

Figure 20:
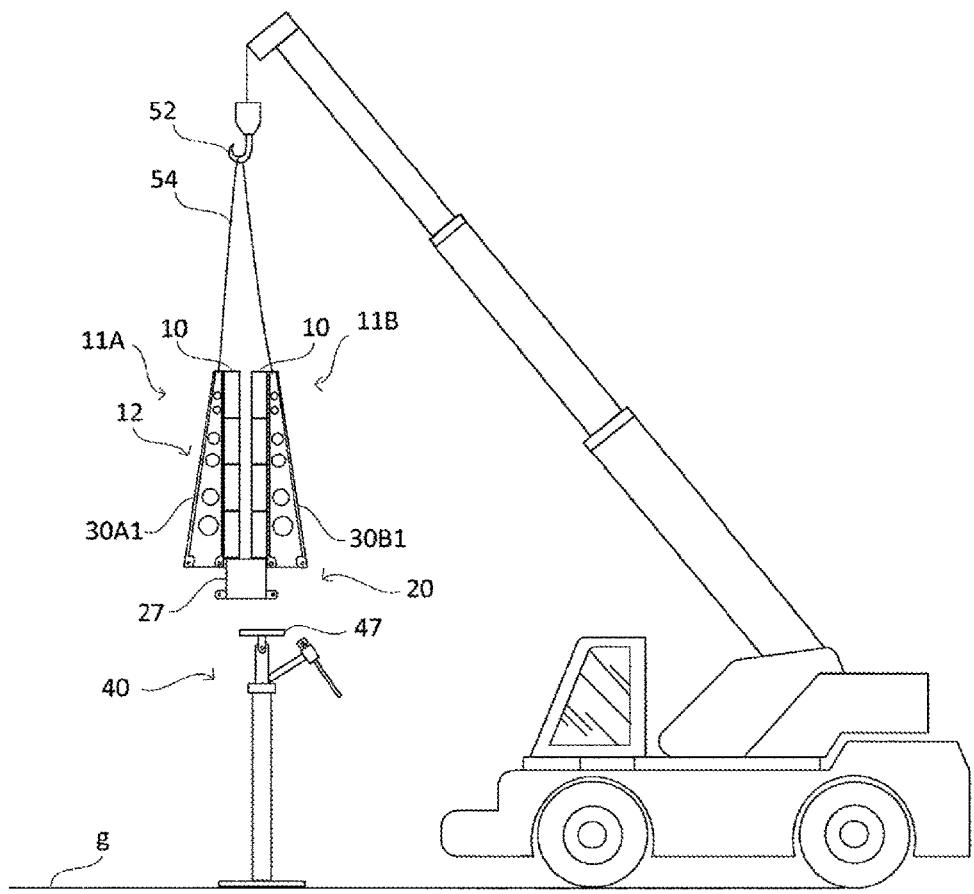
FIG. 20 shows a state where the photovoltaic panel according to the first embodiment of the present invention has been lifted by a crane vehicle.

FIG. 20 shows a state where the photovoltaic panel according to the first embodiment of the present invention has been lifted by a crane vehicle.

With reference to FIG. 20, the photovoltaic panel 12 in which the power generation portions 11A and 11B are at the fold position is lifted by a hook 52 of the crane vehicle by use of the cable 54, and then is transported to a predetermined position, for example, immediately above the movable mounting portion 47 of the pedestal 40.

Specifically, for example, one-end portion of the cable 54 is attached to an end of the power generation portion 11A, and the other end portion of the cable 54 is attached to an end of the power generation portion 11B. The hook 52 is hooked around the center of the cable 54, and the photovoltaic panel 12 is lifted. Then, the lifted photovoltaic panel 12 is moved to immediately above the movable mounting portion 47.

With reference to FIG. 16 again, next, the photovoltaic panel 12 is mounted to the pedestal 40 (step S17), and the power generation portions 11A and 11B are rotated, whereby the power generation portions 11A and 11B are caused to take the light receiving position (step S18).

Figure 21:
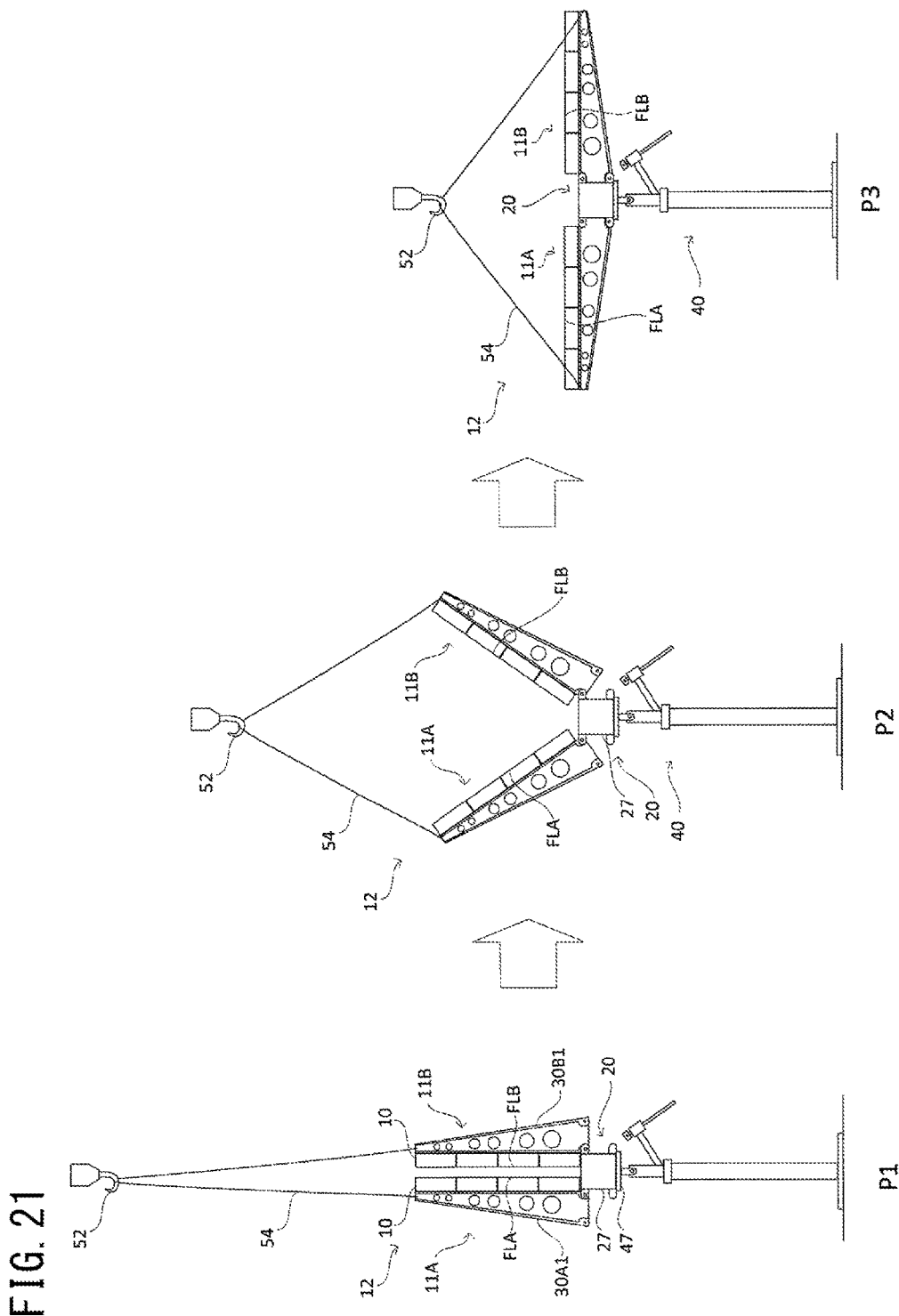
FIG. 21 shows mounting of the photovoltaic panel according to the first embodiment of the present invention to a pedestal and rotation of the power generation portions to a light receiving position.

FIG. 21 shows mounting of the photovoltaic panel according to the first embodiment of the present invention to the pedestal and rotation of the power generation portions to the light receiving position.

With reference to FIG. 21, the photovoltaic panel 12 in a state of being hooked by the hook 52 of the crane vehicle is mounted to the pedestal 40 (state P1). Specifically, for example, the coupling portion 20 of the photovoltaic panel 12 is mounted to the movable mounting portion 47 of the pedestal 40. Here, the coupling portion body 27 may be merely placed at the movable mounting portion 47.

Next, the tension of the cable 54 is loosened, whereby the power generation portions 11A and 11B are caused to take the light receiving position (state P2 and state P3). Specifically, the hook 52 hooking the photovoltaic panel 12 is lowered, whereby the power generation portions 11A and 11B are unfolded due to their own weights. The power generation portions 11A and 11B are unfolded to the light receiving position and then stop. For example, the push bolt 4 of each adjustment mechanism 8 shown in FIG. 14 comes into contact with the coupling portion body 27, whereby rotation of the power generation portions 11A and 11B to the light receiving position is stopped.

Accordingly, the positions of the power generation portions 11A and 11B are restored to the positions realized immediately after the adjustment of the light receiving surface FLA and the light receiving surface FLB has been performed.

With reference to FIG. 16 again, next, the bolt B2 and the nut N2 are mounted to each beam mounting portion 23 of the coupling portion 20, to fix the power generation portions 11A and 11B (step S19).

In the photovoltaic panel 12 according to the first embodiment of the present invention, the cantilever beam 30 is configured to have the adjustment plate portion 5. However, not limited thereto, the cantilever beam 30 may not have the adjustment plate portion 5.

In such a case, for example, by each end Ed shown in FIG. 14 coming into contact with the coupling portion body 27, the power generation portions 11A and 11B can take the light receiving position.

In the photovoltaic panel 12 according to the first embodiment of the present invention, the shape of the cross section of the coupling portion body 27 is a square. However, not limited thereto, the shape of the cross section of the coupling portion body 27 may be a rectangle or a circle, for example.

In the photovoltaic panel 12 according to the first embodiment of the present invention, the cantilever beam 30 is rotatable about the bolt B1 used as the rotation axis. However, not limited thereto, it is sufficient that the cantilever beam 30 is rotatable about a part or the entirety of the coupling portion 20 used as the rotation axis. For example, the cantilever beam 30 may be rotatable, using the central axis of the coupling portion body 27 as the rotation axis.

In the photovoltaic panel 12 according to the first embodiment of the present invention, the adjustment bolt hole 34 of the adjustment plate portion 5 is configured to have a tapped groove. However, not limited thereto, the adjustment bolt hole 34 may not have a tapped groove. For example, two nuts are provided with the adjustment plate portion 5 interposed therebetween, and the push bolt 4 may be fixed by fastening these nuts.

The photovoltaic panel 12 according to the first embodiment of the present invention is configured to include two power generation portions 11, i.e., the power generation portions 11A and 11B. However, not limited thereto, the photovoltaic panel 12 may be configured to include three or more power generation portions 11. In such a case, if at least one set of the power generation portions 11 takes the fold position at which the set of light receiving surfaces are located so as to face each other, it is possible to make the photovoltaic panel 12 compact.

For example, in a case where the photovoltaic panel 12 includes: three power generation portions 11, i.e., first to third power generation portions; and two coupling portions 20, i.e., first and second coupling portions, the first coupling portion couples the first power generation portion and the second power generation portion together, for example. The second coupling portion couples the second power generation portion and the third power generation portion together. In such a configuration, when each power generation portion 11 takes the fold position, the set of the light receiving surface of the first power generation portion and the light receiving surface of the second power generation portion face each other, for example, and the set of the light receiving surface of the second power generation portion and the light receiving surface of the third power generation portion are oriented to the opposite directions, for example.

In the photovoltaic panel 12 according to the first embodiment of the present invention, the hinge portion 36 is configured to include two fixing portions, specifically, for example, the upper fixing portion 21F and the lower fixing portion 22F, along the thickness direction of the power generation portion 11A, 11B at the time when the power generation portion 11A, 11B is at the light receiving position. However, the configuration is not limited thereto.

For example, it is sufficient that the hinge portion 36 is configured to include a plurality of fixing portions along the thickness direction of the power generation portion 11A, 11B at the time when the power generation portion 11A, 11B is at the light receiving position.

For example, in a case where the hinge portion 36 includes three fixing portions along the thickness direction of the power generation portion 11A, 11B at the time when the power generation portion 11A, 11B is at the light receiving position, and if the power generation portion 11A, 11B is caused to take the fold position, a bolt is passed through the uppermost fixing portion among the three fixing portions and through the cantilever beam 30, and no bolt is passed through the other fixing portions. Then, using the bolt passed through the uppermost fixing portion as the central axis, the power generation portion 11A, 11B is rotated to the fold position.

[Modification 1]

In the photovoltaic panel 12 according to the first embodiment of the present invention, the adjustment mechanism (restoration mechanism) is configured to be fixed to the power generation portion 11, but the configuration is not limited thereto. For example, the adjustment mechanism may be configured to be fixed to the coupling portion 20.

Figure 22:
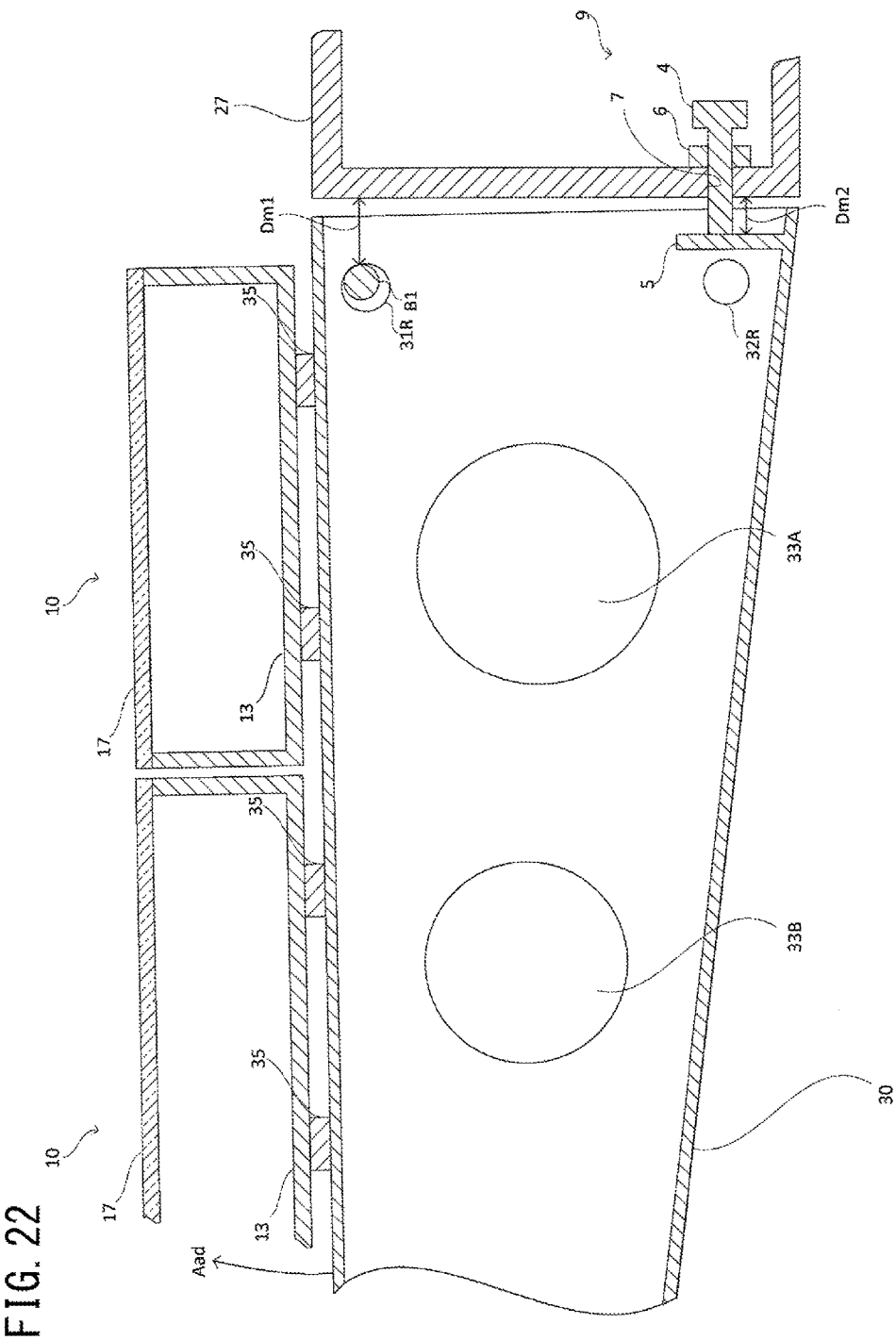
FIG. 22 shows a configuration of a modification of the adjustment mechanism shown in FIG. 15.

FIG. 22 shows a configuration of a modification of the adjustment mechanism shown in FIG. 15.

With reference to FIG. 22, the photovoltaic panel 12 includes an adjustment mechanism (restoration mechanism) 9. The adjustment mechanism 9 includes the push bolt 4, the nut 6, and an adjustment bolt hole 7 provided in the coupling portion body 27. Here, the coupling portion body 27 is a hollow member, for example.

The adjustment mechanism 9 is a screw mechanism provided in order to adjust the angle of the cantilever beam 30 relative to the short-side direction of the coupling portion 20, and is fixed to the coupling portion body 27.

Specifically, the adjustment bolt hole 7 has a tapped groove. The push bolt 4 is fitted in the adjustment bolt hole 7. The nut 6 is provided between the head of the push bolt 4 and the adjustment plate portion 5.

The leading end of the push bolt 4 in the adjustment mechanism 9 is in contact with the adjustment plate portion 5 of the cantilever beam 30. Here, the adjustment plate portion 5 does not have the adjustment bolt hole 34.

In this state, the adjustment mechanism 9 can adjust, for example, the distance between the coupling portion body 27 and the power generation portion 11A, specifically, the distance between the coupling portion body 27 and the adjustment plate portion 5 of the cantilever beam 30.

For example, by rotating the push bolt 4 in a state where the leading end of the push bolt 4 is in contact with the cantilever beam 30, it is possible to increase a distance Dm2 between the adjustment plate portion 5 and the coupling portion 20, for example.

At this time, a distance Dm1 between the coupling portion 20 and the bolt B1 passed through the mounting hole 31R and the like hardly changes. Thus, as indicated by the arrow Aad, the cantilever beam 30 is rotated about the bolt B1 used as the rotation axis, in the direction toward the power generation module 10. The push bolt 4 in the coupling portion body 27 is fixed by the nut 6.

By adjusting the adjustment mechanism 9 in each cantilever beam 30, it is possible to make the light receiving surface FLA and the light receiving surface FLB closer to an ideal plane with no distortion, and it is possible to accurately direct the light receiving surface FLA and the light receiving surface FLB to the same direction in a case where the power generation portion 11A and the power generation portion 11B are at the light receiving position.

The adjustment mechanism 9 stores, for example, the adjusted distance between the coupling portion body 27 and the power generation portion 11A, specifically, the adjusted distance between the coupling portion body 27 and the adjustment plate portion 5. For example, after the power generation portion 11A, 11B is rotated from the light receiving position to the fold position, the power generation portion 11A, 11B is rotated toward the light receiving position. In this case, the push bolt 4 comes into contact with the cantilever beam 30, thereby stopping the rotation of the power generation portion 11A, 11B.

At the position where the push bolt 4 has stopped the rotation of the power generation portion 11A, 11B, the distance between the adjustment plate portion 5 and the coupling portion body 27 is the same as the distance before the power generation portion 11A, 11B is rotated to the fold position. Accordingly, the position taken by the power generation portion 11A, 11B is the same as the position before the power generation portion 11A, 11B is rotated to the fold position. That is, the adjustment mechanism 9 can restore the light receiving position for the power generation portion 11A, 11B.

[Modification 2]

The power generation portions 11A and 11B in the photovoltaic panel 12 according to the first embodiment of the present invention are configured to take the fold position at which the light receiving surface FLA and the light receiving surface FLB face each other when transported, for example, but the configuration is not limited thereto. For example, the power generation portions 11A and 11B may be configured such that the light receiving surface FLA and the light receiving surface FLB are located so as to be oriented to opposite directions when transported.

Hereinafter, in the photovoltaic panel 12, the positions of the power generation portion 11A and the power generation portion 11B in a state where the power generation portion 11A and the power generation portion 11B are disposed such that the light receiving surface FLA and the light receiving surface FLB are oriented to opposite directions will also be referred to as an open position.

Figure 23:
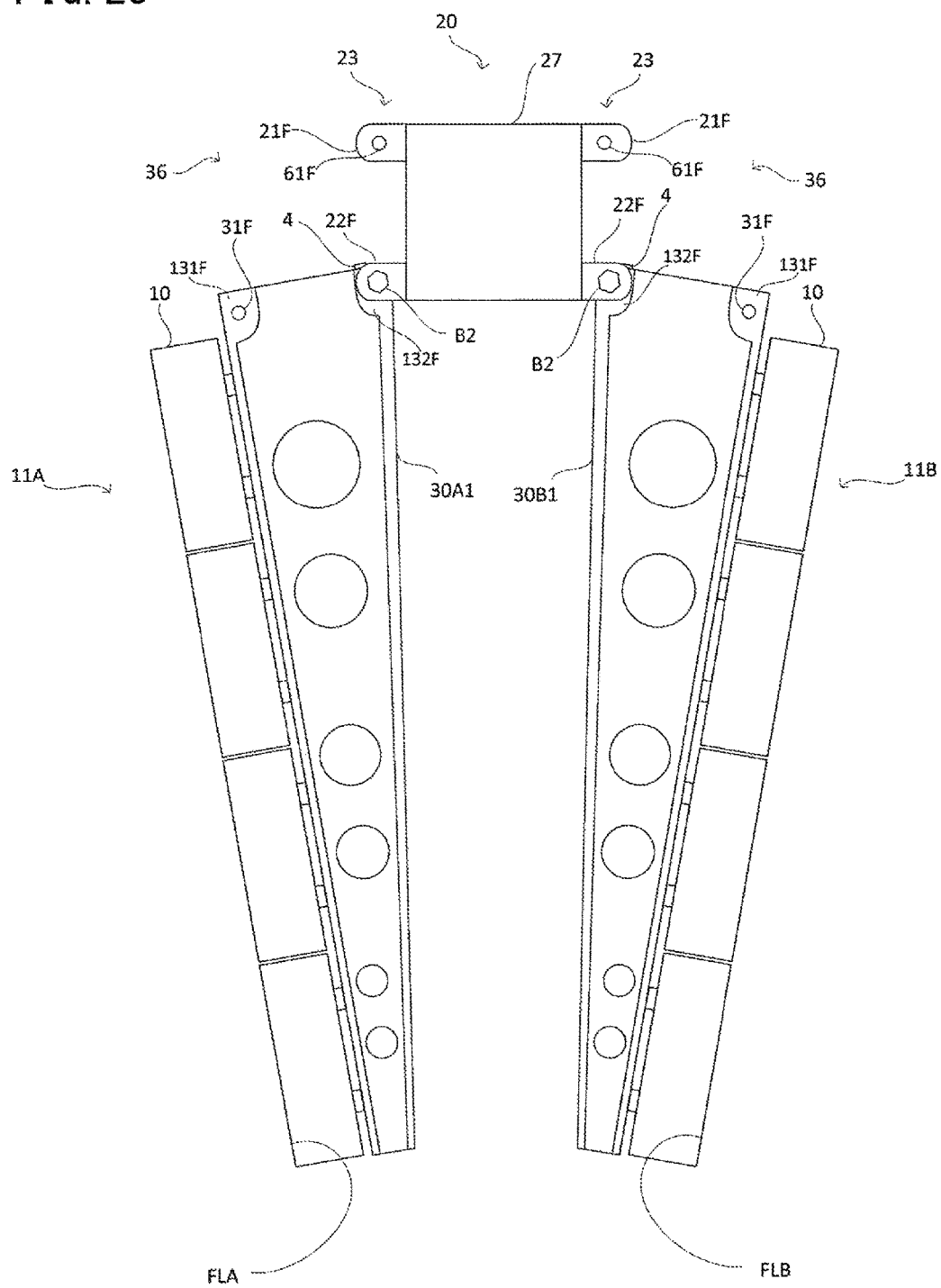
FIG. 23 shows a state where the power generation portions are at an open position in the photovoltaic panel according to the first embodiment of the present invention.

FIG. 23 shows a state where the power generation portions are at the open position in the photovoltaic panel according to the first embodiment of the present invention.

With reference to FIG. 23, each hinge portion 36 rotatably supports its corresponding power generation portion 11. Specifically, the bolt B2 and the nut N2 (see FIG. 12) are mounted to each beam mounting portion 23. More specifically, also as shown in FIGS. 6, 7 and 9, the bolt B2 is passed through the mounting hole 62F in the lower fixing portion 22F, the mounting holes 32F and 32R in the cantilever beam 30, and the mounting hole 62R in the lower fixing portion 22R in this order, and is fixed by the nut N2. Meanwhile, the bolt B1 and the nut N1 are not mounted.

In this state, the bolt B2, the nut N2, the lower fixing portion 22F in the beam mounting portion 23, the beam-side lower fixing portions 132F and 132R in the cantilever beam 30, and the lower fixing portion 22R in the beam mounting portion 23 constitute the hinge portion.

The photovoltaic panel 12 is transported to, for example, the installation site of the photovoltaic apparatus 101 in a state where the power generation portions 11A and 11B are at the open position.

Figure 24:
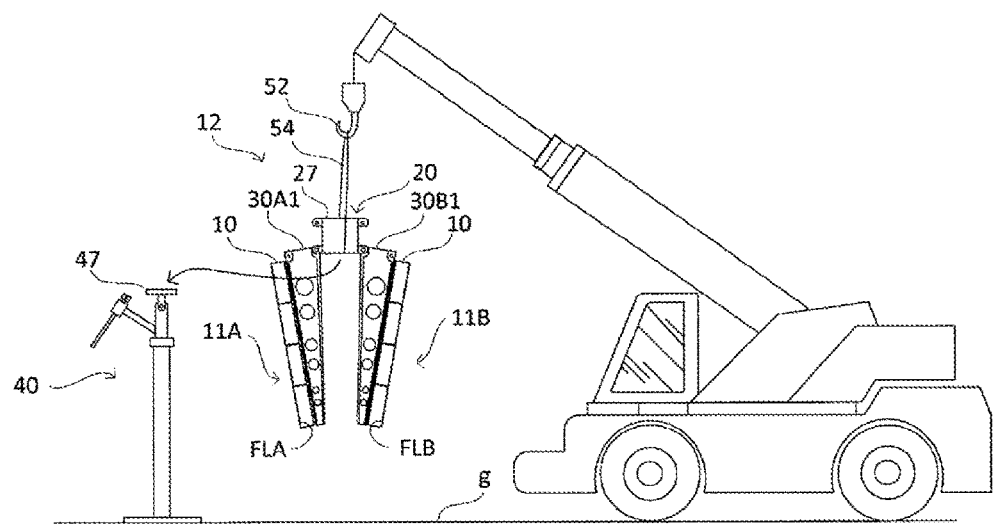
FIG. 24 shows a state where the photovoltaic panel shown in FIG. 23 has been lifted by a crane vehicle.

FIG. 24 shows a state where the photovoltaic panel shown in FIG. 23 has been lifted by a crane vehicle.

With reference to FIG. 24, the photovoltaic panel 12 in which the power generation portions 11A and 11B are at the fold position is lifted by the hook 52 of the crane vehicle by use of the cable 54, and then is transported to a predetermined position, for example, immediately above the movable mounting portion 47 of the pedestal 40.

Specifically, for example, both end portions of the cable 54 is attached to the coupling portion body 27. The hook 52 is hooked around the center of the cable 54, and the photovoltaic panel 12 is lifted. Then, the lifted photovoltaic panel 12 is moved to immediately above the movable mounting portion 47.

Figure 25:
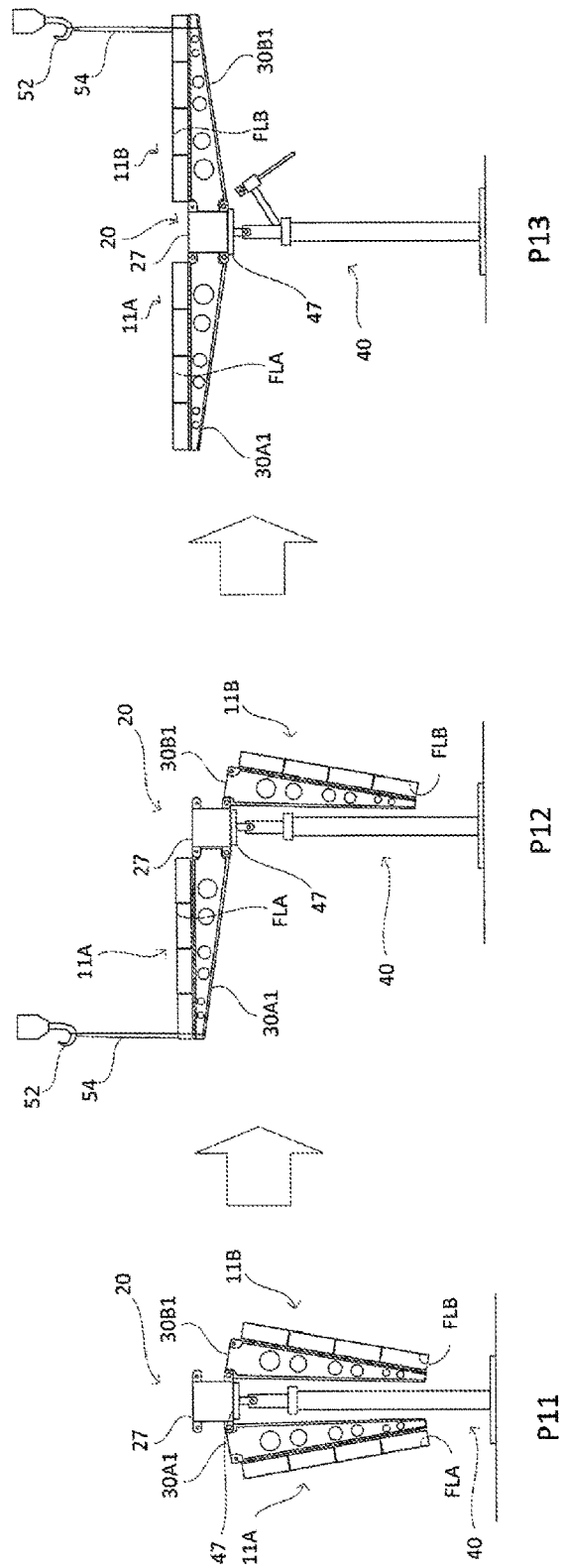
FIG. 25 shows mounting of the photovoltaic panel according to the first embodiment of the present invention to the pedestal and rotation of the power generation portions to the light receiving position.

FIG. 25 shows mounting of the photovoltaic panel according to the first embodiment of the present invention to the pedestal and rotation of the power generation portions to the light receiving position.

With reference to FIG. 25, the coupling portion body 27 of the photovoltaic panel 12 is mounted to the movable mounting portion 47 of the pedestal 40 (state P11).

Next, for example, the cable 54 is attached to an end of the power generation portion 11A and pulled up by the hook 52, whereby the power generation portion 11A is rotated to the light receiving position (state P12). Then, the bolt B1 and the nut N1 are mounted to the beam mounting portion 23, to fix the power generation portion 11A.

Next, for example, the cable 54 is attached to an end of the power generation portion 11B and pulled up by the hook 52, whereby the power generation portion 11B is rotated to the light receiving position (state P13). Then, the bolt B1 and the nut N1 are mounted to the beam mounting portion 23, to fix the power generation portion 11B.

Here, in FIG. 24, the power generation portions 11A and 11B are in a state of being hung down from the lateral sides of the coupling portion 20. Thus, in order to mount the coupling portion 20 to the movable mounting portion 47, it is sufficient to raise the hook 52 to an extent that allows the coupling portion 20 to be located immediately above the movable mounting portion 47.

Meanwhile, in the method for mounting the photovoltaic panel 12 to the pedestal 40 shown in FIG. 20 and FIG. 21, it is necessary to raise the hook 52 to a position higher than the height position obtained by adding the length in the up-down direction of the lifted photovoltaic panel 12 to the height of the movable mounting portion 47.

Thus, for example, in a case where a large crane vehicle cannot be procured at the installation site, or for example, in a case where the hook 52 cannot be raised to a high position because of the environment of the installation site, the configuration in which the power generation portions 11A and 11B are caused to take the open position is useful when the photovoltaic panel 12 is to be mounted to the pedestal 40.

Meanwhile, a concentrator photovoltaic panel includes several tens of power generation modules, and a frame for arranging and fixing the power generation modules, for example. In addition, the light receiving surface of such a photovoltaic panel is in a shape of a quadrilateral whose sides are each several meters long, for example. Thus, when a photovoltaic apparatus is to be installed, it is difficult to transport such a photovoltaic panel in an assembled state, from a plant to an installation site by a truck or the like. Therefore, the photovoltaic panel is assembled at the installation site in many cases.

However, in a case where the photovoltaic panel is assembled at the installation site, a longer work time is often needed compared with a case where the photovoltaic panel is assembled at the plant. This increases the work cost. In assembling the photovoltaic panel, machinery such as cranes and the like is used in many steps. This also increases the procurement cost for the machinery.

In contrast to this, in the photovoltaic panel according to the first embodiment of the present invention, each of the power generation portions 11A and 11B includes a plurality of the power generating elements 14 which each generate power in accordance with the amount of received light, and has a light receiving surface. The coupling portion 20 couples the power generation portions 11 together. The power generation portions 11 are coupled together so as to be rotatable about the coupling portion 20 used as the rotation axis. The power generation portions 11 can, by being rotated, take the light receiving position at which the power generation portions 11 are located such that the light receiving surface FLA and the light receiving surface FLB are oriented to the same direction, and the fold position at which the power generation portions 11 are located such that the light receiving surface FLA and the light receiving surface FLB face each other.

According to this configuration, by disposing the power generation portions 11 at the fold position, it is possible to make the photovoltaic panel 12 compact. Thus, for example, the photovoltaic panel 12 assembled at the plant can be loaded onto a truck or the like in a state where the power generation portions 11 are disposed at the fold position, and can be carried into the installation site of the photovoltaic apparatus 101. Then, at the installation site, the power generation portions 11 of the carried-in photovoltaic panel 12 are rotated from the fold position to the light receiving position, whereby the shape of the photovoltaic panel 12 can be easily changed to a shape that allows the power generation portions 11 to receive sunlight. Thus, for example, compared with a case where components of the photovoltaic panel 12 are carried into the installation site and the photovoltaic panel 12 is assembled at the installation site, the number of work steps at the installation site can be reduced, and the work time can be shortened.

With the method for manufacturing the photovoltaic apparatus according to the first embodiment of the present invention, the power generation portions 11 of the photovoltaic panel 12 are rotated, whereby the power generation portions 11 are caused to take the fold position at which the light receiving surface FLA and the light receiving surface FLB are located so as to face each other. The photovoltaic panel 12 in which the power generation portions 11 are at the fold position is transported. The transported photovoltaic panel 12 is lifted by use of the cable 54, to be carried to a predetermined position. The tension of the cable 54 is loosened at the predetermined position to rotate the power generation portions 11, whereby the power generation portions 11 are caused to take the light receiving position at which the light receiving surface FLA and the light receiving surface FLB are located so as to be oriented to the same direction.

In this manner, by rotating the power generation portions 11 to be disposed at the fold position, it is possible to make the photovoltaic panel 12 compact. Thus, for example, the photovoltaic panel 12 assembled at a plant can be loaded onto a truck or the like in a state where the power generation portions 11 are disposed at the fold position, and can be carried into the installation site of the photovoltaic apparatus 101. Accordingly, for example, compared with a case where components of the photovoltaic panel are carried into the installation site and the photovoltaic panel is assembled at the installation site, the number of work steps at the installation site can be reduced, and the work time can be shortened. In addition, by loosening the tension of the cable 54 lifting the photovoltaic panel 12, to rotate the power generation portions 11 to the light receiving position, it is possible to shorten the work time for changing the shape of the photovoltaic panel 12 such that the power generation portions 11 can receive sunlight.

Therefore, with the photovoltaic panel and the method for manufacturing the photovoltaic apparatus according to the first embodiment of the present invention, the work at the installation site can be simplified.

In addition, by performing the assembling step of the photovoltaic panel 12 at a plant, for example, easiness of work can be increased compared with a case where the assembling step is performed at the installation site of the photovoltaic apparatus 101. In addition, because the work time at the installation site is shortened, delay of installation work of the photovoltaic apparatus 101 under influence of weather can be prevented.

In the photovoltaic panel according to the first embodiment of the present invention, the adjustment mechanism 8 restores the light receiving position.

According to this configuration, for example, after the power generation portions 11 are rotated from the light receiving position to the fold position and the photovoltaic panel 12 is transported, the power generation portions 11 can be easily returned to the original position. Specifically, for example, after the angles and the like of the light receiving surface FLA and the light receiving surface FLB are adjusted in a state where the power generation portions 11 are at the light receiving position, and then the power generation portions 11 are rotated from the light receiving position to the fold position, if the power generation portions 11 are rotated to the light receiving position, the power generation portions 11 can be returned to the state where the light receiving surface FLA and the light receiving surface FLB have been adjusted.

In the photovoltaic panel according to the first embodiment of the present invention, the hinge portions 36 rotatably support the power generation portions 11. For example, the upper fixing portions 21F and the lower fixing portions 22F are located on the lateral sides of the coupling portion 20 and along the thickness direction of the power generation portions 11 at the light receiving position, and can fix the power generation portions 11. For example, the lower fixing portion 22F being the fixing portion on the opposite surface side to the light receiving surface FLA of the power generation portion 11A can cancel the fixed state of the power generation portion 11A.

Thus, according to the configuration in which the photovoltaic panel includes the hinge portions 36, the power generation portions 11 can be easily rotated. In addition, by use of the fixing portions provided on the lateral sides of the coupling portion 20, the power generation portions 11 can be easily made to enter a fixed state at the light receiving position, or the power generation portions 11 can be easily made to enter a rotatable state.

In the photovoltaic panel according to the first embodiment of the present invention, the power generation portions 11 further can, by being rotated, take the open position at which the power generation portions 11 are located such that the light receiving surface FLA and the light receiving surface FLB are oriented to opposite directions.

According to this configuration, a transportation method and an installation method for the photovoltaic panel 12 can be flexibly selected in accordance with a condition such as machinery to be used or ambient environment.

Next, another embodiment of the present invention will be described with reference to the drawings. It should be noted that the same or corresponding parts in the drawings are denoted by the same reference signs, and description thereof is not repeated.

Second Embodiment

The present embodiment relates to a photovoltaic apparatus that has a different configuration for fixing the power generation portion at the light receiving position, compared with that of the photovoltaic apparatus according to the first embodiment. Except the contents described below, this photovoltaic apparatus is the same as the photovoltaic apparatus according to the first embodiment.

Figure 26:
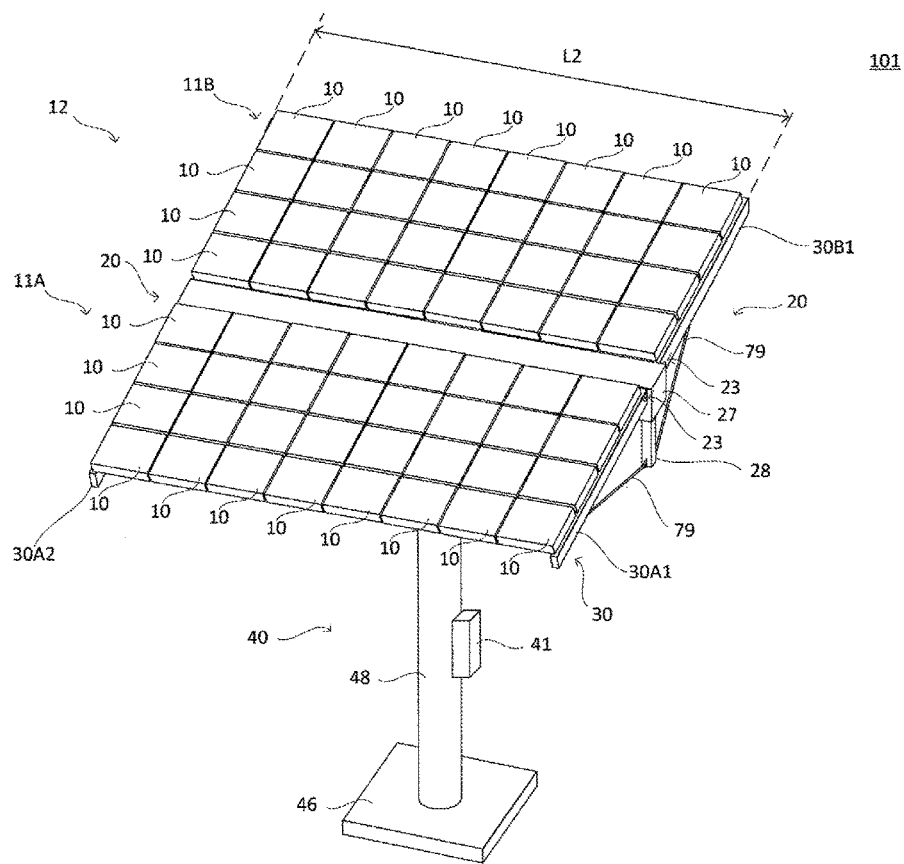
FIG. 26 is a perspective view of the photovoltaic apparatus according to a second embodiment of the present invention.
Figure 27:
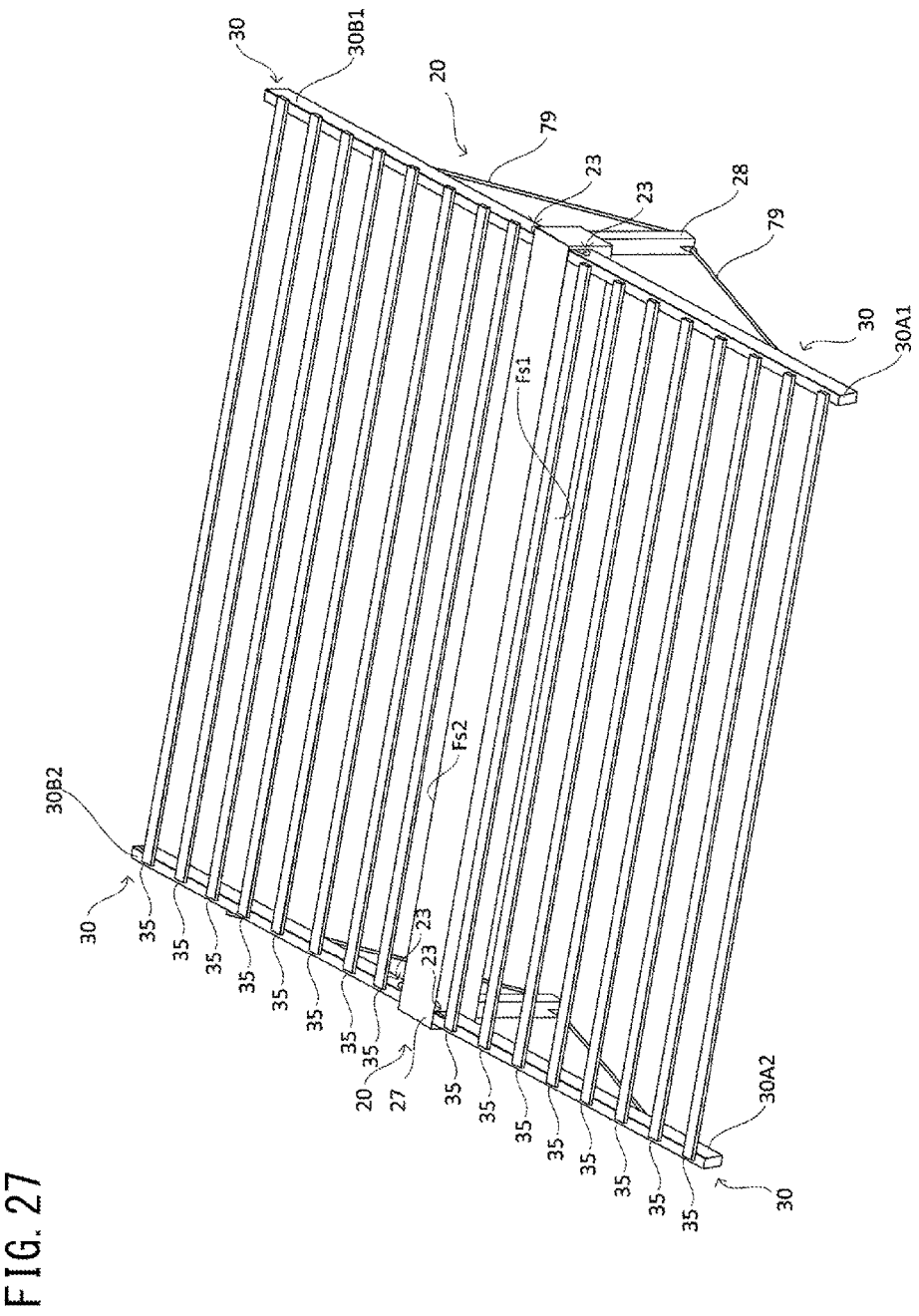
FIG. 27 shows a state where the power generation modules have been removed from the photovoltaic panel shown in FIG. 26.

FIG. 26 is a perspective view of the photovoltaic apparatus according to the second embodiment of the present invention. FIG. 27 shows a state where the power generation modules have been removed from the photovoltaic panel shown in FIG. 26.

With reference to FIG. 26 and FIG. 27, the photovoltaic apparatus 101 includes the photovoltaic panel 12 and the pedestal 40. The photovoltaic panel 12 includes the power generation portions 11A and 11B, the coupling portion 20, and a sun direction sensor not shown.

The power generation portion 11A includes: the cantilever beams 30A1 and 30A2; eight bridge portions 35 mounted to upper portions of the cantilever beams 30A1 and 30A2; and 4 rows×8 columns of power generation modules 10, i.e., 32 power generation modules 10, mounted to upper portions of the bridge portions 35.

The power generation portion 11B includes: the cantilever beams 30B1 and 30B2; eight bridge portions 35 mounted to upper portions of the cantilever beams 30B1 and 30B2; and 4 rows×8 columns of power generation modules 10 arranged and mounted to upper portions of the bridge portions 35.

The pedestal 40 includes the control panel 41, the post 48, the base 46, and the rotation head 49 similar to that shown in FIG. 2. The rotation head 49 includes the elevation drive portion 42, the push rod 44, the azimuth drive portion 45, and the movable mounting portion 47.

The coupling portion 20 couples the power generation portion 11A and the power generation portion 11B together. Specifically, the coupling portion 20 has a columnar shape, for example, and couples the power generation portions 11A and 11B together which are located side by side in a direction perpendicular to the longitudinal direction of the coupling portion 20.

The coupling portion 20 includes the coupling portion body 27, four beam mounting portions 23, two protruding portions 28, and four support members (restoration mechanism) 79. In the coupling portion 20, two beam mounting portions 23 are provided to each of the side face Fs1 of the coupling portion body 27 and the side face Fs2 being the side face on the opposite side to the side face Fs1. The cantilever beams 30A1 and 30A2 are mounted to the coupling portion body 27, at the two beam mounting portions 23 provided to the side face Fs1, respectively. The cantilever beams 30B1 and 30B2 are mounted to the coupling portion body 27, at the two beam mounting portions 23 provided to the side face Fs2, respectively.

The cantilever beam 30A1 and the cantilever beam 30B1 are located along the same plane. The cantilever beam 30A2 and the cantilever beam 30B2 are located along the same plane.

The protruding portions 28 are members extending downwardly from the coupling portion body 27, and are provided so as to correspond to the set of the cantilever beam 30A1 and the cantilever beam 30B1, and the set of the cantilever beam 30A2 and the cantilever beam 30B2. Each support member 79 is a bar-shaped member, for example, and has a certain degree of rigidity. A first end portion of each support member 79 is fixed to its corresponding protruding portion 28, and a second end portion on the opposite side to the first end portion of the support member 79 is fixed to its corresponding power generation portion 11, specifically, to the cantilever beam 30 of the power generation portion 11. In this state, the support member 79 obliquely supports the cantilever beam 30 relative to the longitudinal direction of the cantilever beam 30.

The bridge portions 35 are each a bar-shaped member, and are provided to upper portions of the cantilever beams 30. Specifically, one-end portions of eight bridge portions 35 are mounted to the upper portion of the cantilever beam 30A1, and the other end portions of these bridge portions 35 are mounted to the upper portion of the cantilever beam 30A2.

Further, one-end portions of eight bridge portions 35 are mounted to the upper portion of the cantilever beam 30B1, and the other end portions of these bridge portions 35 are mounted to the upper portion of the cantilever beam 30B2.

Figure 28:
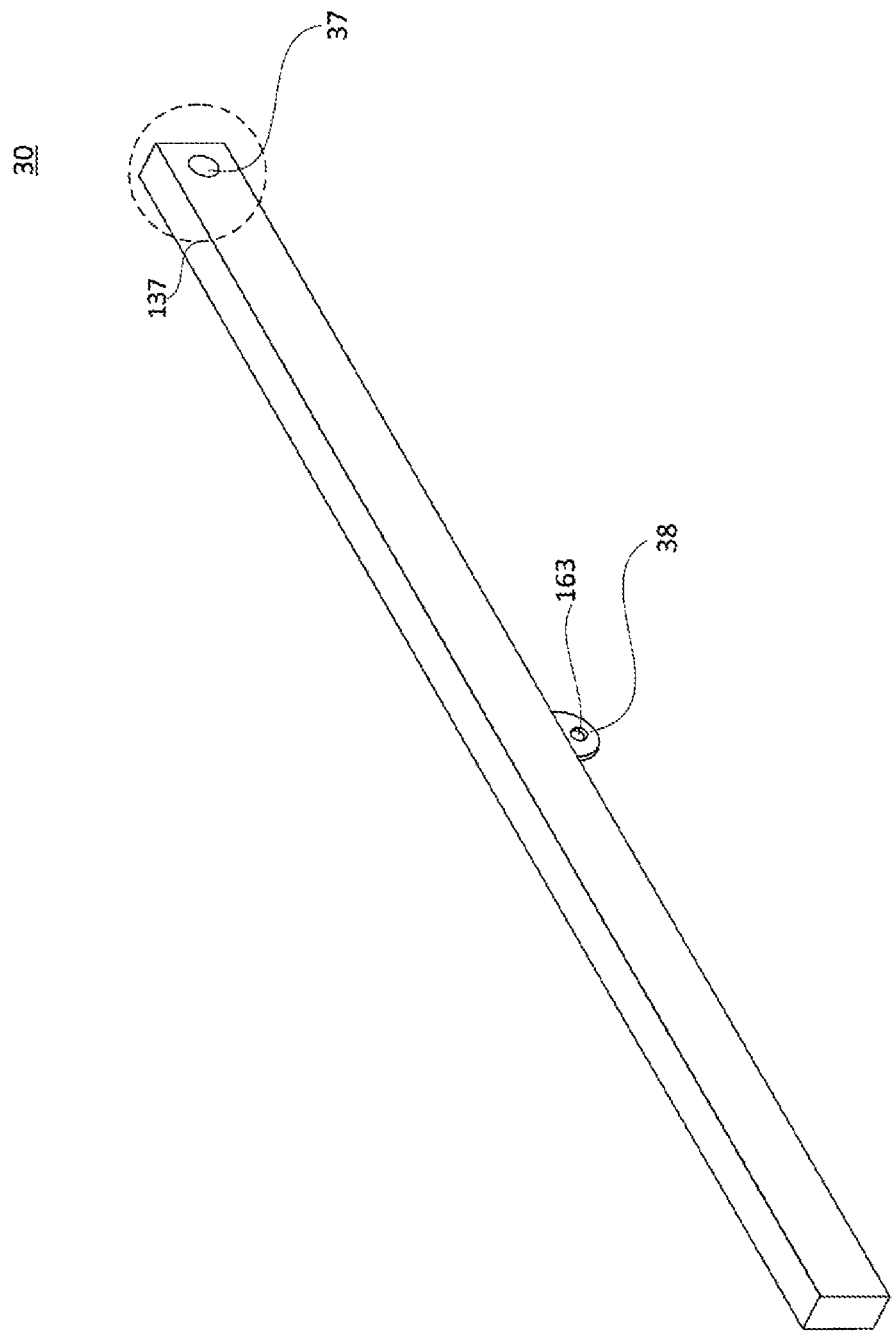
FIG. 28 shows in detail a configuration of the cantilever beam in the photovoltaic panel according to the second embodiment of the present invention.

FIG. 28 shows in detail a configuration of the cantilever beam in the photovoltaic panel according to the second embodiment of the present invention.

With reference to FIG. 28, the cantilever beam 30 includes a beam-side fixing portion 137 and a beam-side mounting portion (second fixing portion) 38. The beam-side fixing portion 137 has a through-hole 37. The beam-side mounting portion 38 has a beam-side mounting hole 163. The cantilever beam 30 is a member having a rectangular column shape, for example. The through-hole 37 is provided so as to mount the cantilever beam 30 thereof to the coupling portion 20.

The beam-side mounting portion 38 can fix the second end portion of the support member 79. Specifically, the second end portion of the support member 79 can be fixed to the beam-side mounting hole 163 in the beam-side mounting portion 38. The through-hole 37 and the beam-side mounting hole 163 are provided at a certain distance from each other in the longitudinal direction of the cantilever beam 30.

Figure 29:
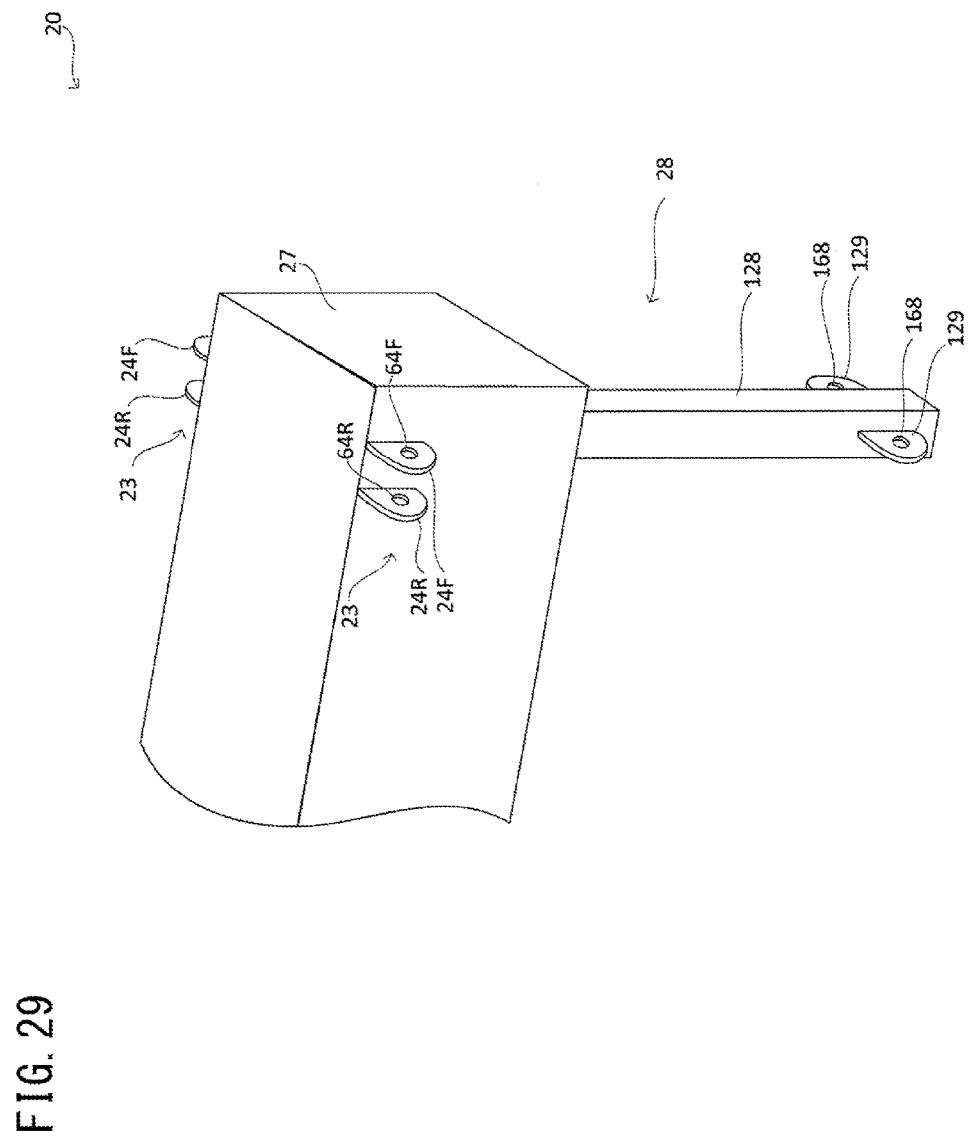
FIG. 29 shows in detail a configuration of the coupling portion in the photovoltaic panel according to the second embodiment of the present invention.

FIG. 29 shows in detail a configuration of the coupling portion in the photovoltaic panel according to the second embodiment of the present invention.

With reference to FIG. 29, in the coupling portion 20, each beam mounting portion 23 includes rotation support portions 24F and 24R, the bolt B1 (see FIG. 30), and a nut not shown. The rotation support portions 24R and 24F have mounting holes 64R and 64F, respectively.

Each protruding portion 28 includes a protruding portion body 128 and two coupling-side mounting portions (first fixing portion) 129. Each coupling-side mounting portion 129 has a coupling-side mounting hole 168. The protruding portion body 128 is a columnar-shaped member extending downwardly from the coupling portion body 27. The two coupling-side mounting portions 129 are provided to the side faces of the protruding portion body 128 along the short-side direction of the coupling portion body 27, respectively.

Each coupling-side mounting portion 129 can fix the first end portion of its corresponding support member 79. Specifically, the first end portion of the support member 79 can be fixed to the coupling-side mounting hole 168 in the coupling-side mounting portion 129. The beam mounting portion 23 and the coupling-side mounting holes 168 are provided at a certain distance from each other in the longitudinal direction of the protruding portion body 128.

Figure 30:
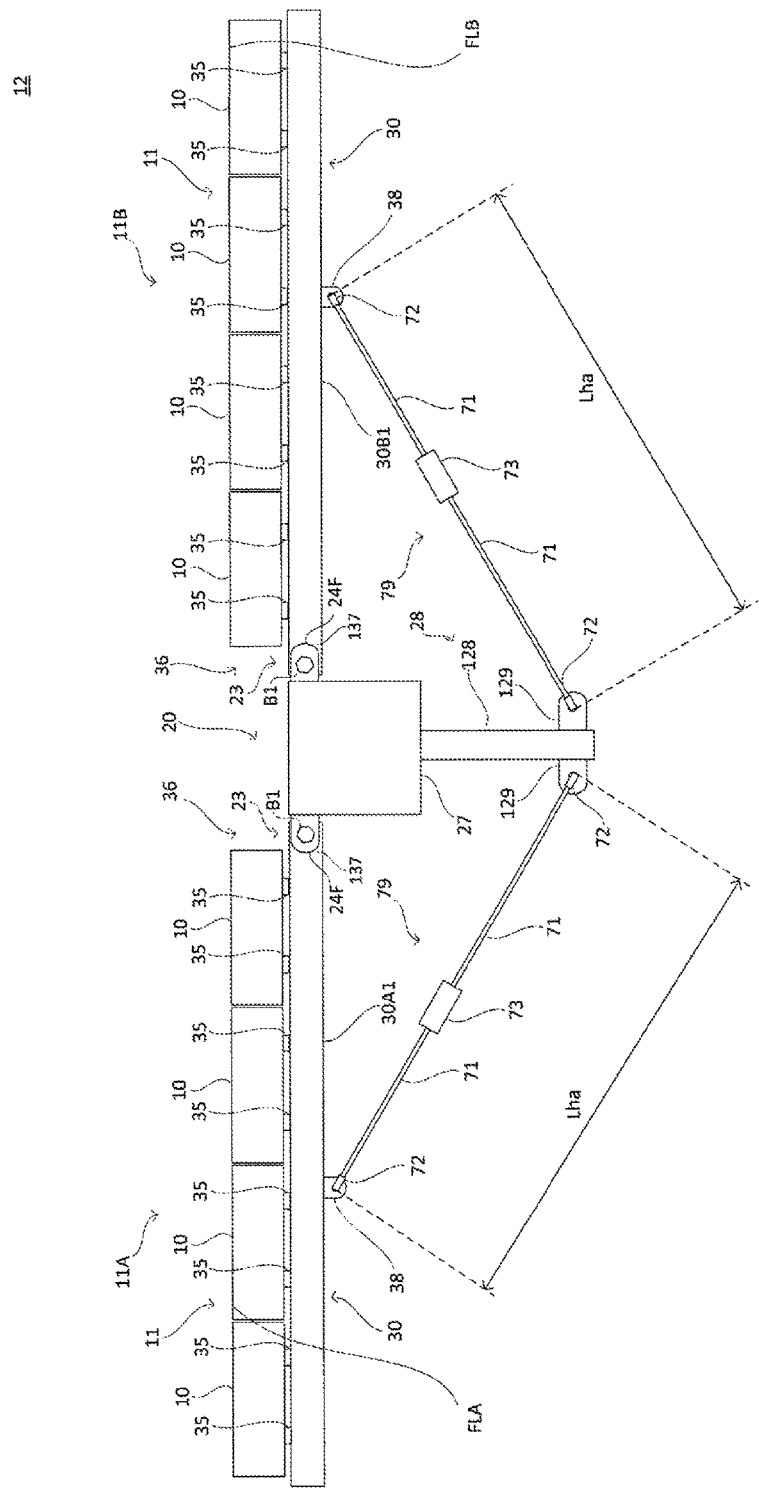
FIG. 30 is a side view of the photovoltaic panel according to the second embodiment of the present invention.

FIG. 30 is a side view of the photovoltaic panel according to the second embodiment of the present invention.

With reference to FIG. 30, the photovoltaic panel 12 includes a plurality of hinge portions 36. Each hinge portion 36 includes: the beam-side fixing portion 137 of the cantilever beam 30; and the beam mounting portion 23 provided so as to correspond to the cantilever beam 30.

Each hinge portion 36 rotatably supports its corresponding power generation portion 11. Meanwhile, the support members 79 fix the power generation portions 11A and 11B at the light receiving position. Specifically, the support members 79 block rotation of the power generation portions 11A and 11B using the hinge portions 36.

More specifically, the first end portions of the support members 79 are mounted to the coupling-side mounting holes 168 of the coupling-side mounting portions 129, and the second end portions of the support members 79 are mounted to the beam-side mounting holes 163 in the beam-side mounting portions 38, respectively.

The power generation portions 11A and 11B are at the light receiving position in a state where the support members 79 are fixed to the beam-side mounting portions 38 and the coupling-side mounting portions 129, respectively.

Each support member 79 includes two rods 71, two rod attachment/detachment portions 72, and a length adjustment portion 73. To a first end portion of each rod 71, the rod attachment/detachment portion 72 is mounted for mounting the support member 79 to the beam-side mounting hole 163 or the coupling-side mounting hole 168. The rod attachment/detachment portion 72 is a tie rod, for example.

Second end portions on the opposite side to the first end portions of the respective rods 71, i.e., the end portions on the side to which the rod attachment/detachment portions 72 are not mounted, are coupled together by the length adjustment portion 73. The rods 71 are linearly fixed as a whole by the length adjustment portion 73.

Each support member 79 is extendable, and can adjust a length Lha thereof. Specifically, the length adjustment portion 73 is a turnbuckle, for example, and by being rotated about the longitudinal direction of the rod 71, the length adjustment portion 73 can change the length Lha. That is, the length adjustment portion 73 can adjust the distance between the beam-side mounting portion 38 and the coupling-side mounting portion 129, specifically, the distance between the beam-side mounting hole 163 and the coupling-side mounting hole 168. Accordingly, for example, the length adjustment portion 73 can adjust the angle of the cantilever beam 30 relative to the short-side direction of the coupling portion body 27.

Either one or both of the beam-side mounting portion 38 and the coupling-side mounting portion 129 can cancel the state where the support member 79 is fixed thereto. Specifically, the support member 79 can be removed from either one or both of the beam-side mounting portion 38 and the coupling-side mounting portion 129. For example, in a case where the power generation portions 11A and 11B are caused to take the fold position, the fixation of the support members 79 is canceled.

Figure 31:
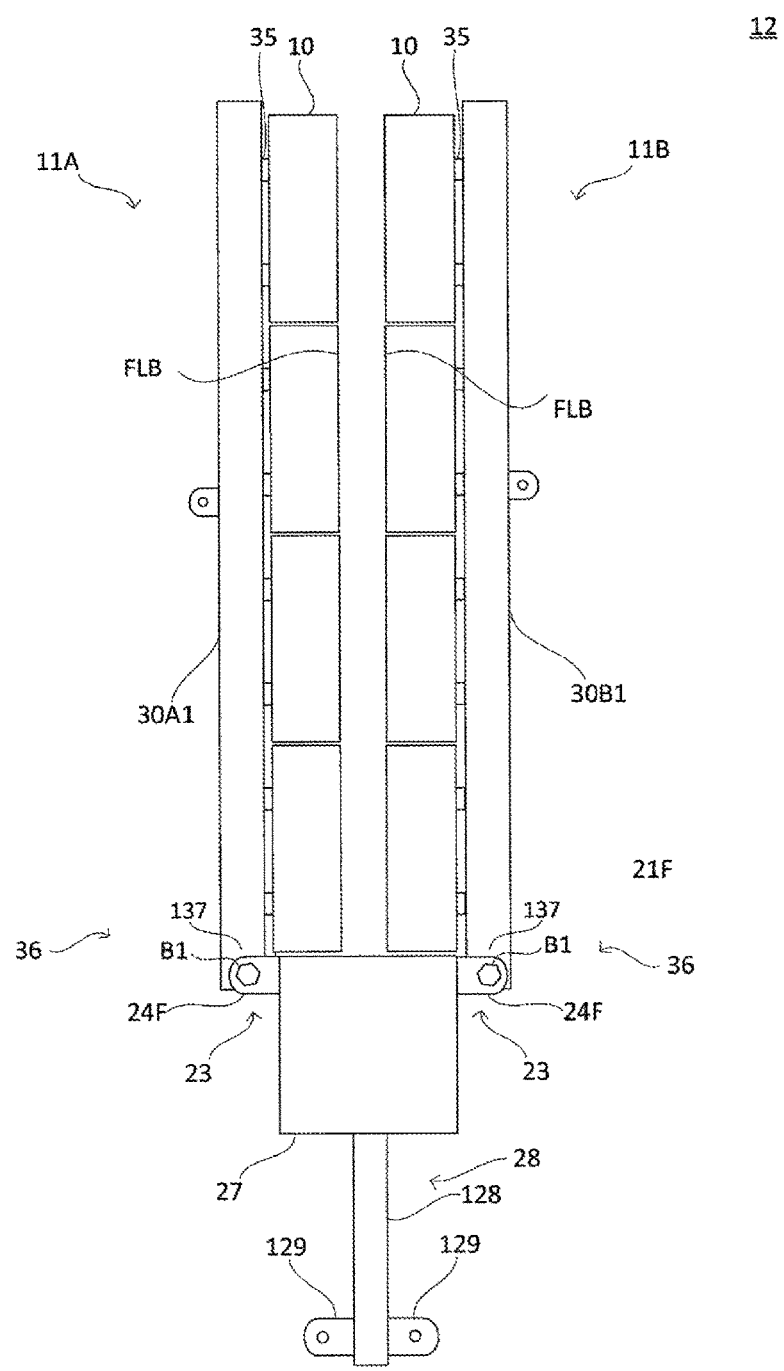
FIG. 31 is a side view showing a state where the power generation portions in the photovoltaic panel according to the second embodiment of the present invention are at the fold position.

FIG. 31 is a side view showing a state where the power generation portions in the photovoltaic panel according to the second embodiment of the present invention are at the fold position.

With reference to FIG. 31, at the fold position, the power generation portion 11A and the power generation portion 11B are located such that the light receiving surface FLA and the light receiving surface FLB face each other.

In a case where the power generation portion 11A, 11B is caused to take the light receiving position again, the power generation portion 11A, 11B at the fold position is rotated toward the light receiving position, and then, the support member 79 is mounted to the beam-side mounting hole 163 and the coupling-side mounting hole 168. Accordingly, the power generation portion 11A, 11B is fixed at the light receiving position. That is, the support member 79 can restore the light receiving position for the power generation portion 11A, 11B.

It should be noted that, in a state where the support member 79 is removed from either one of or both of the beam-side mounting portion 38 and the coupling-side mounting portion 129, the power generation portion 11A, 11B can take the open position at which the light receiving surface FLA and the light receiving surface FLB are oriented to opposite directions.

[Modification 1]

In the photovoltaic panel 12 according to the second embodiment of the present invention, the support member 79 (restoration mechanism) is configured to obliquely support the cantilever beam 30 relative to the longitudinal direction of the cantilever beam 30. However, the configuration is not limited thereto. For example, the support member 79 may be configured to perpendicularly support the cantilever beam 30 relative to the longitudinal direction of the cantilever beam 30.

Figure 32:
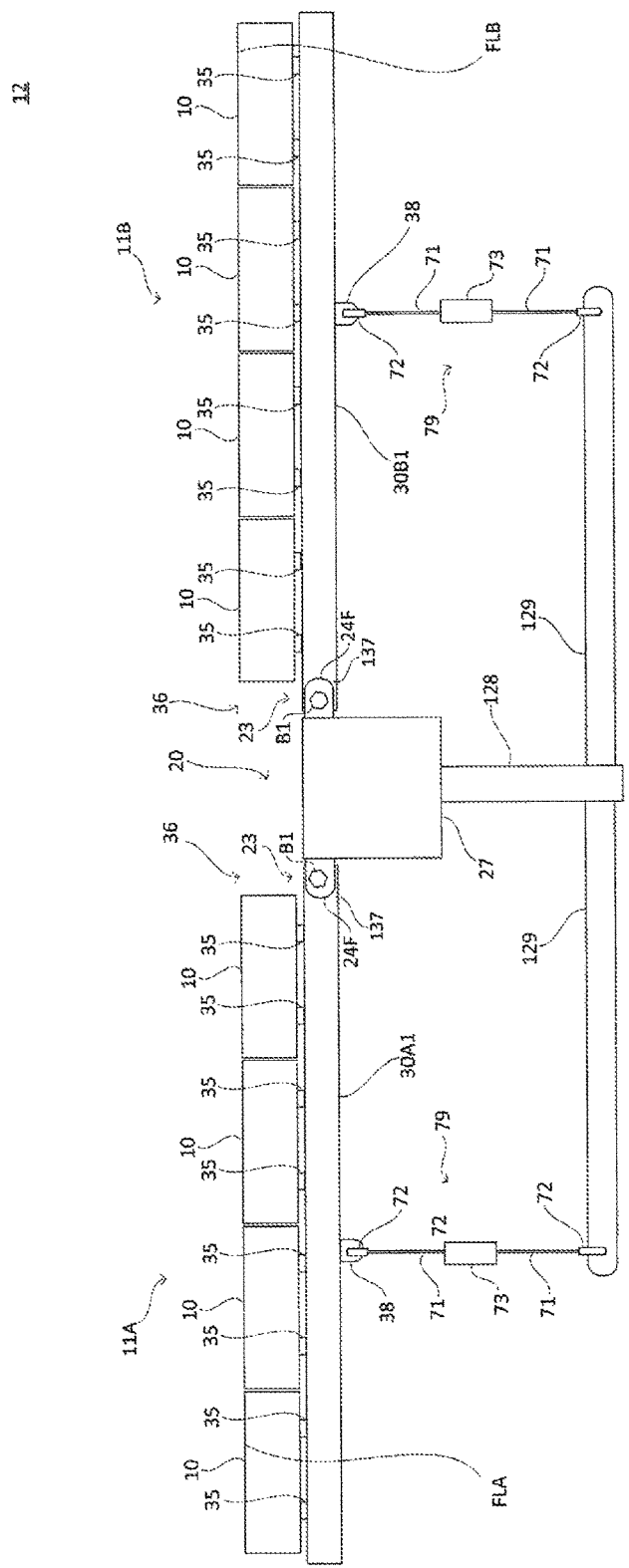
FIG. 32 is a side view showing a configuration of a modification of the photovoltaic panel according to the second embodiment of the present invention.

FIG. 32 is a side view showing a configuration of a modification of the photovoltaic panel according to the second embodiment of the present invention.

With reference to FIG. 32, each support member 79 supports its corresponding cantilever beam 30 perpendicularly thereto from below. Specifically, each coupling-side mounting portion 129 is longer in the longitudinal direction of the cantilever beam 30, than the coupling-side mounting portion 129 shown in FIG. 30, and has the coupling-side mounting hole 168 as shown in FIG. 29 near the leading end thereof, for example. The coupling-side mounting hole 168 and the beam-side mounting hole 163 in the beam-side mounting portion 38 (see FIG. 28) are located along the thickness direction of the power generation portion 11. The second end portion of the support member 79 is fixed to the beam-side mounting hole 163 and the first end portion of the support member 79 is fixed to the coupling-side mounting hole 168.

[Modification 2]

In the photovoltaic panel 12 according to the second embodiment of the present invention, the support member 79 (restoration mechanism) is configured to support the cantilever beam 30 from below. However, the configuration is not limited thereto. For example, the adjustment mechanism may be configured to support the cantilever beam 30 from above.

Figure 33:
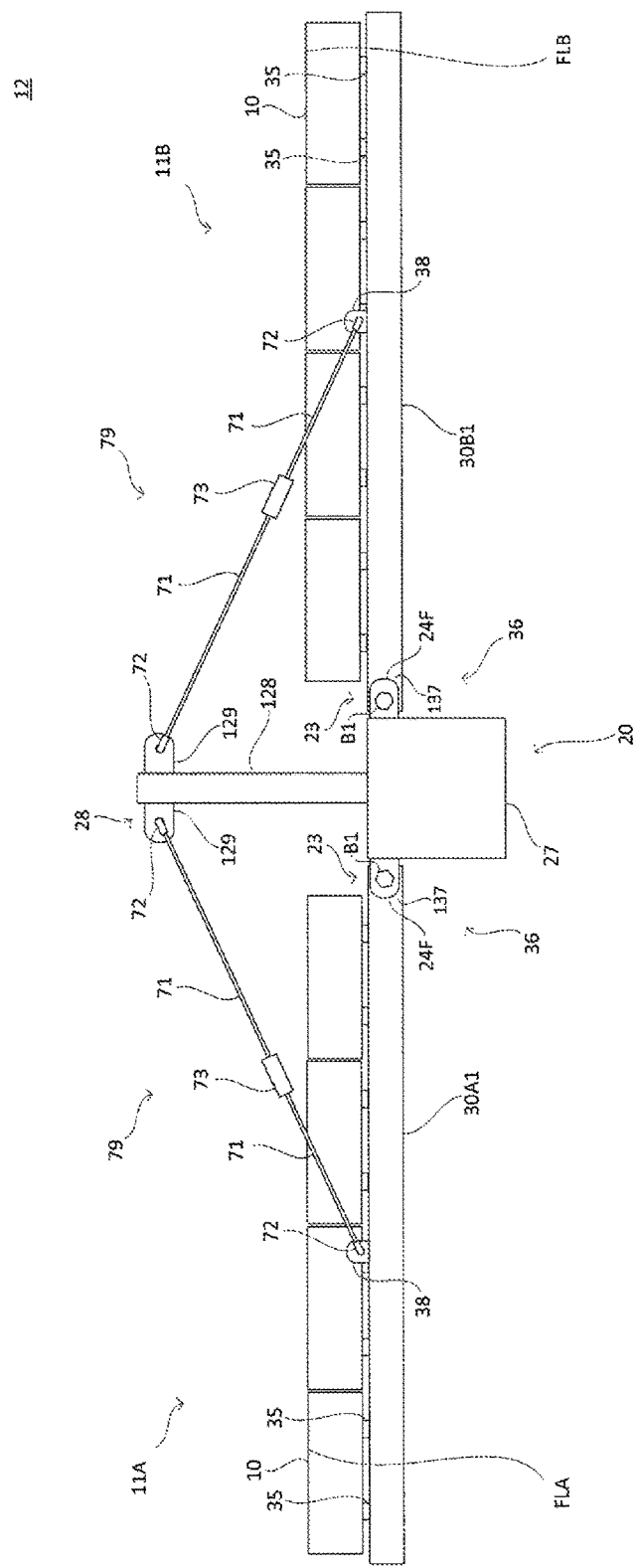
FIG. 33 is a side view showing a configuration of a modification of the photovoltaic panel according to the second embodiment of the present invention.

FIG. 33 is a side view showing a configuration of a modification of the photovoltaic panel according to the second embodiment of the present invention.

With reference to FIG. 33, each support member 79 supports its corresponding cantilever beam 30 from above. Specifically, the protruding portion 28 extends upwardly from the coupling portion body 27. Each beam-side mounting portion 38 is provided to the upper side of its corresponding cantilever beam 30. The second end portion of the support member 79 is fixed to the beam-side mounting hole 163 (see FIG. 28) in the beam-side mounting portion 38, and the first end portion of the support member 79 is fixed to the coupling-side mounting hole 168 (see FIG. 29) in the coupling-side mounting portion 129.

In the case where the support member 79 supports the cantilever beam 30 from above, the support member 79 may not be a bar-shaped member having a certain degree of rigidity, but may be a member such as a cable, for example.

As described above, in the photovoltaic panel according to the second embodiment of the present invention, the support member 79 restores the light receiving position.

According to this configuration, for example, after the power generation portions 11 are rotated from the light receiving position to the fold position and the photovoltaic panel is transported, the power generation portions 11 can be easily returned to the original position. Specifically, for example, after the angles and the like of light receiving surfaces are adjusted in a state where the power generation portions 11 are at the light receiving position, and then, the power generation portions 11 are rotated from the light receiving position to the fold position, if the power generation portions 11 are rotated to the light receiving position, the power generation portions 11 can be returned to the state where the light receiving surfaces have been adjusted.

In the photovoltaic panel according to the second embodiment of the present invention, the hinge portions 36 rotatably support the power generation portions 11. The coupling-side mounting portions 129 being the first fixing portions can fix the first end portions of the support members 79. The beam-side mounting portions 38 being the second fixing portions can fix the second end portions of the support members 79. The power generation portions 11 take the light receiving position in a state where each support member 79 is fixed to the coupling-side mounting portion 129 and the beam-side mounting portion 38. Either one or both of the coupling-side mounting portion 129 and the beam-side mounting portion 38 can cancel the fixed state of the support member 79.

Thus, according to the configuration in which the photovoltaic panel 12 includes the hinge portions 36, the power generation portions 11 can be easily rotated. In addition, by respectively fixing the support members 79 to the coupling-side mounting portions 129 of the protruding portion 28 and the beam-side mounting portions 38 of the power generation portions 11, it is possible to easily fix the power generation portions 11 at the light receiving position. Further, by removing each support member 79 from either one or both of the protruding portion and the power generation portion 11, it is possible to easily make the power generation portions 11 enter a rotatable state.

For example, by changing the length of the support member 79, the distance between the fixing place of the support member 79 in the protruding portion 28 and the fixing place of the support member 79 in the power generation portion 11 can be changed. Thus, for example, the angle between the light receiving surface FLA and the light receiving surface FLB can be adjusted.

The photovoltaic panel 12 according to each of the first embodiment and the second embodiment of the present invention is a photovoltaic panel in a concentrator photovoltaic apparatus. However, not limited thereto, the photovoltaic panel 12 may be a photovoltaic panel in another photovoltaic apparatus.

The other configurations and operation are the same as those of the photovoltaic apparatus according to the first embodiment, and thus detailed description thereof is not repeated here.

The above embodiments are merely illustrative in all aspects and should not be recognized as being restrictive. The scope of the present invention is defined by the scope of the claims rather than by the description above, and is intended to include meaning equivalent to the scope of the claims and all modifications within the scope.

The above description includes the features in the additional notes below.

[Additional Note 1]

A photovoltaic panel including:

a plurality of power generation portions each having a light receiving surface, each power generation portion including a plurality of power generating elements each configured to generate power in accordance with an amount of received light; and a coupling portion including a bolt and configured to couple each power generation portion by using the bolt, wherein each power generation portion as a whole has a plate shape, the coupling portion has a columnar shape, the power generation portions are located so as to be arranged in a direction perpendicular to a longitudinal direction of the coupling portion, each power generation portion is coupled so as to be rotatable about the bolt used as a rotation axis, the bolt being included in the coupling portion, and the power generation portions are capable of, by being rotated, taking a light receiving position at which the power generation portions are located such that the light receiving surfaces of the power generation portions are oriented to an identical direction, and a fold position at which the power generation portions are located such that a set of the light receiving surfaces of the power generation portions face each other.

[Additional Note 2]

A method for manufacturing a photovoltaic apparatus provided with a photovoltaic panel, the photovoltaic panel including:

a plurality of power generation portions each having a light receiving surface, each power generation portion including a plurality of power generating elements each configured to generate power in accordance with an amount of received light; and a coupling portion including a bolt and configured to couple each power generation portion by using the bolt, wherein each power generation portion as a whole has a plate shape, the coupling portion has a columnar shape, the power generation portions are located so as to be arranged in a direction perpendicular to a longitudinal direction of the coupling portion, and each power generation portion is coupled so as to be rotatable about the bolt used as a rotation axis, the bolt being included in the coupling portion, the method comprising:

a step of rotating the power generation portions, to cause the power generation portions to take a fold position at which a set of the light receiving surfaces of the power generation portions are located so as to face each other;

a step of transporting the photovoltaic panel in which the power generation portions are at the fold position;

a step of lifting the transported photovoltaic panel by use of a cord-like member, and carrying the photovoltaic panel to a predetermined position; and a step of loosening tension of the cord-like member at the predetermined position to rotate the power generation portions, thereby causing the power generation portions to take a light receiving position at which the light receiving surfaces of the power generation portions are located so as to be oriented to an identical direction.

REFERENCE SIGNS LIST 4 push bolt
5 adjustment plate portion
6, N1, N2 nut
7, 34 adjustment bolt hole
8, 9 adjustment mechanism (restoration mechanism)
10 power generation module
11, 11A, 11B power generation portion
12 photovoltaic panel
13 housing
14 power generating element
15 FPC
16 Fresnel lens
17 light receiving portion
18 conductive portion
20 coupling portion
21F, 21R upper fixing portion
22F, 22R lower fixing portion
23 beam mounting portion
24F, 24R rotation support portion
27 coupling portion body
28 protruding portion
30, 30A1, 30A2, 30A3, 30B1, 30B2, 30B3 cantilever beam
31F, 31R, 32F, 32R mounting hole
33A, 33B, 33C, 33D, 33E, 33F lightening hole
35 bridge portion
36 hinge portion
37 through-hole
38 beam-side mounting portion (second fixing portion)
40 pedestal
41 control panel
42 elevation drive portion
44 push rod
45 azimuth drive portion
46 base
47 movable mounting portion
48 post
49 rotation head
52 hook
54 cable
61F, 61R, 62F, 62R, 64F, 64R mounting hole
71 rod
72 rod attachment/detachment portion
73 adjustment portion
79 support member (restoration mechanism)
101 photovoltaic apparatus
128 protruding portion body
129 coupling-side mounting portion (first fixing portion)
131F, 131R beam-side upper fixing portion
132F, 132R beam-side lower fixing portion
137 beam-side fixing portion
163 beam-side mounting hole
168 coupling-side mounting hole
B1, B2 bolt
Ca cargo bed Ed end
FLA light receiving surface
FLB light receiving surface
Fb lower face
Fo main surface
Fs1 side face
Fs2 side face
g ground

The invention claimed is:

1. A method for manufacturing a photovoltaic apparatus provided with a photovoltaic panel, the photovoltaic panel including:
- a plurality of power generation portions each having a light receiving surface, each power generation portion including a plurality of power generating elements each configured to generate power in accordance with an amount of received light; and
- a coupling portion configured to couple each power generation portion so as to be rotatable about the coupling portion used as a rotation axis, the method comprising:
- a step of adjusting the light receiving surfaces of the respective electric power generation portions so as to be oriented to face an identical direction;
- a step of rotating the power generation portions, to cause the power generation portions to take a fold position at which a set of the light receiving surfaces of the power generation portions are located so as to face each other;
- a step of transporting the photovoltaic panel in which the power generation portions are at the fold position;
- a step of lifting the transported photovoltaic panel by use of a cord-like member, and carrying the photovoltaic panel to a predetermined position; and
- a step of loosening tension of the cord-like member at the predetermined position to rotate the power generation portions and restore the power generation portions to the positions realized immediately after the adjustment of the light receiving surfaces, thereby causing the power generation portions to take a light receiving position at which the light receiving surfaces of the power generation portions are located so as to be oriented to the identical direction wherein the step of adjusting the light receiving surfaces of the respective power generation portions is performed by adjusting an angle of each power generation portion with respect to the coupling portion, wherein the adjustment of the angle of each power generation portion with respect to the coupling portion is performed by rotating a push bolt.

2. The method for manufacturing a photovoltaic apparatus according to claim 1, wherein the step of rotating the power generation portions is after the step of adjusting the light receiving surfaces to face the identical direction.

* * * * *